(12) United States Patent
Prajapati

(10) Patent No.: US 12,316,721 B2
(45) Date of Patent: May 27, 2025

(54) DATA COMPRESSION TECHNIQUES FOR EFFICIENT NETWORK MANAGEMENT

(71) Applicant: Itron, Inc., Liberty Lake, WA (US)

(72) Inventor: Sunilkumar jagdishbhai Prajapati, Bangalore (IN)

(73) Assignee: Itron, Inc., Liberty Lake, WA (US)

( * ) Notice: Subject to any disclaimer, the term of this patent is extended or adjusted under 35 U.S.C. 154(b) by 674 days.

(21) Appl. No.: 17/709,329

(22) Filed: Mar. 30, 2022

(65) Prior Publication Data
US 2023/0319167 A1    Oct. 5, 2023

(51) Int. Cl.
| | |
|---|---|
| *H04L 12/26* | (2006.01) |
| *H03M 7/30* | (2006.01) |
| *H04L 69/04* | (2022.01) |
| *H04L 69/324* | (2022.01) |

(52) U.S. Cl.
CPC .............. *H04L 69/04* (2013.01); *H03M 7/60* (2013.01); *H04L 69/324* (2013.01)

(58) Field of Classification Search
None
See application file for complete search history.

(56) References Cited

U.S. PATENT DOCUMENTS

| | | | |
|---|---|---|---|
| 7,197,142 B2 | 3/2007 | Alten | |
| 8,046,173 B2 | 10/2011 | Evans et al. | |
| 10,044,369 B1 * | 8/2018 | Paris | H03M 7/40 |
| 10,972,126 B2 | 4/2021 | Fenney et al. | |
| 2003/0039357 A1 | 2/2003 | Alten | |
| 2005/0093873 A1 * | 5/2005 | Paltashev | G06T 9/00 |
| | | | 345/581 |
| 2005/0273274 A1 | 12/2005 | Evans et al. | |
| 2007/0294531 A1 | 12/2007 | Alten | |
| 2008/0270439 A1 | 10/2008 | Evans et al. | |
| 2010/0305449 A1 | 12/2010 | Wegener et al. | |

(Continued)

FOREIGN PATENT DOCUMENTS

WO    WO2005122022 A2    12/2005

OTHER PUBLICATIONS

Office Action for U.S. Appl. No. 17/709,316, mailed on Jun. 20, 2023, Sunilkumar jagdishbhai Prajapati, "Data Compression Techniques for Efficient Network Management", 5 pages.

*Primary Examiner* — Zewdu A Beyen
(74) *Attorney, Agent, or Firm* — Lee & Hayes, P.C.

(57) ABSTRACT

Techniques for data compression for efficient network management are described herein. In one example, group(s) of bytes are formed from among input bytes to be compressed. The groups are formed by including bytes having at least a certain number (e.g., three) zero-valued most significant bits (MSBs). A byte of input data having several zero-valued MSBs may be in several groups. A group having the largest product (number of bytes in the group times number of zero-valued MSBs in all bytes in the group) may be selected. A compressed-bytes array may be formed with data of the selected group of bytes, wherein the number of zero-valued MSBs originally present in all of the bytes of the group of bytes has been removed (to compress the array). An uncompressed-bytes array may be formed with bytes of the input bytes of data not in the selected group of bytes. An address-bit array may be formed to indicate the array in which data associated with each of the input bytes of data is stored.

20 Claims, 19 Drawing Sheets

(56) References Cited

U.S. PATENT DOCUMENTS

| | | | |
|---|---|---|---|
| 2010/0331689 A1* | 12/2010 | Wegener | G01S 7/52034 600/443 |
| 2013/0054546 A1* | 2/2013 | Solihin | G06F 12/0223 707/693 |
| 2013/0301890 A1* | 11/2013 | Kaempfer | H04N 19/194 382/131 |
| 2015/0309650 A1 | 10/2015 | Ahmed et al. | |
| 2019/0110082 A1* | 4/2019 | Fenney | H04N 19/176 |
| 2020/0007150 A1 | 1/2020 | Lacey et al. | |
| 2020/0007156 A1 | 1/2020 | Fenney | |
| 2020/0177902 A1 | 6/2020 | Jun et al. | |
| 2020/0344189 A1 | 10/2020 | Cui et al. | |
| 2021/0304441 A1 | 9/2021 | Yang | |
| 2022/0027158 A1 | 1/2022 | Dasika et al. | |
| 2022/0256164 A1 | 8/2022 | Bond et al. | |
| 2022/0256178 A1 | 8/2022 | Bond et al. | |
| 2023/0319166 A1 | 10/2023 | Prajapati | |

* cited by examiner

DATA COMPRESSION TECHNIQUES FOR EFFICIENT NETWORK MANAGEMENT

BACKGROUND

Networks—particularly those having battery-powered devices and/or limited available radio frequency bandwidths—are limited in the amount of data that can be transmitted and received using known technologies. Accordingly, improvements to networking infrastructure would be welcome.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components. Moreover, the figures are intended to illustrate general concepts, and not to indicate required and/or necessary elements.

DETAILED DESCRIPTION

Overview

This disclosure describes systems and techniques for data compression, packet header and packet payload formation, increased and/or more efficient network throughput and bandwidth utilization, and reduced energy used in data transmission and data reception.

As seen below, "re-indexing" and "value-mapping" are two new compression techniques. Removal of a number of most significant bits (MSBs) from all bytes in the packet payload is a third compression technique. A packet header of a packet may indicate if there was compression, and if so what compression and/or encoding technique was used.

Overview of "Re-Indexing" Compression

Techniques for data compression and/or encoding for efficient network management are described herein. In one example of data compression, three data structures are created, including a first-instance array, an index array, and an address-bit array. The first-instance array includes the "first-instance" of a byte value received from input data. The index array includes pointers to locations within the first-instance array of byte values that were previously obtained from the input data. The address-bit array includes one bit for each byte of input data. For example, the address-bit array includes a sequence of zeros and ones associated with the sequence of incoming bytes. Each "zero" indicates that the byte should be appended to or removed from the first-instance array. Each "one" indicates that the next value found in the index array should be used as a pointer to a byte value in the first-instance array.

As the first-instance array and the index array are being created, each input byte that is a "first-instance" of that value (i.e., the byte's value has not been previously seen in the input data) is put into the first-instance array, a pointer within the first-instance array is incremented, and a zero is appended to the address-bit array. However, if the input byte is not a "first-instance" of the byte's value (i.e., an input byte of that value has previously been input) then a pointer to that value in the first-instance array is added to the index array, a pointer within the first-instance array is incremented, and a one is appended to the address-bit array. Accordingly, values of each byte of input data is encoded. The bytes can be decoded and/or decompressed by reversing the process.

Figure 2:
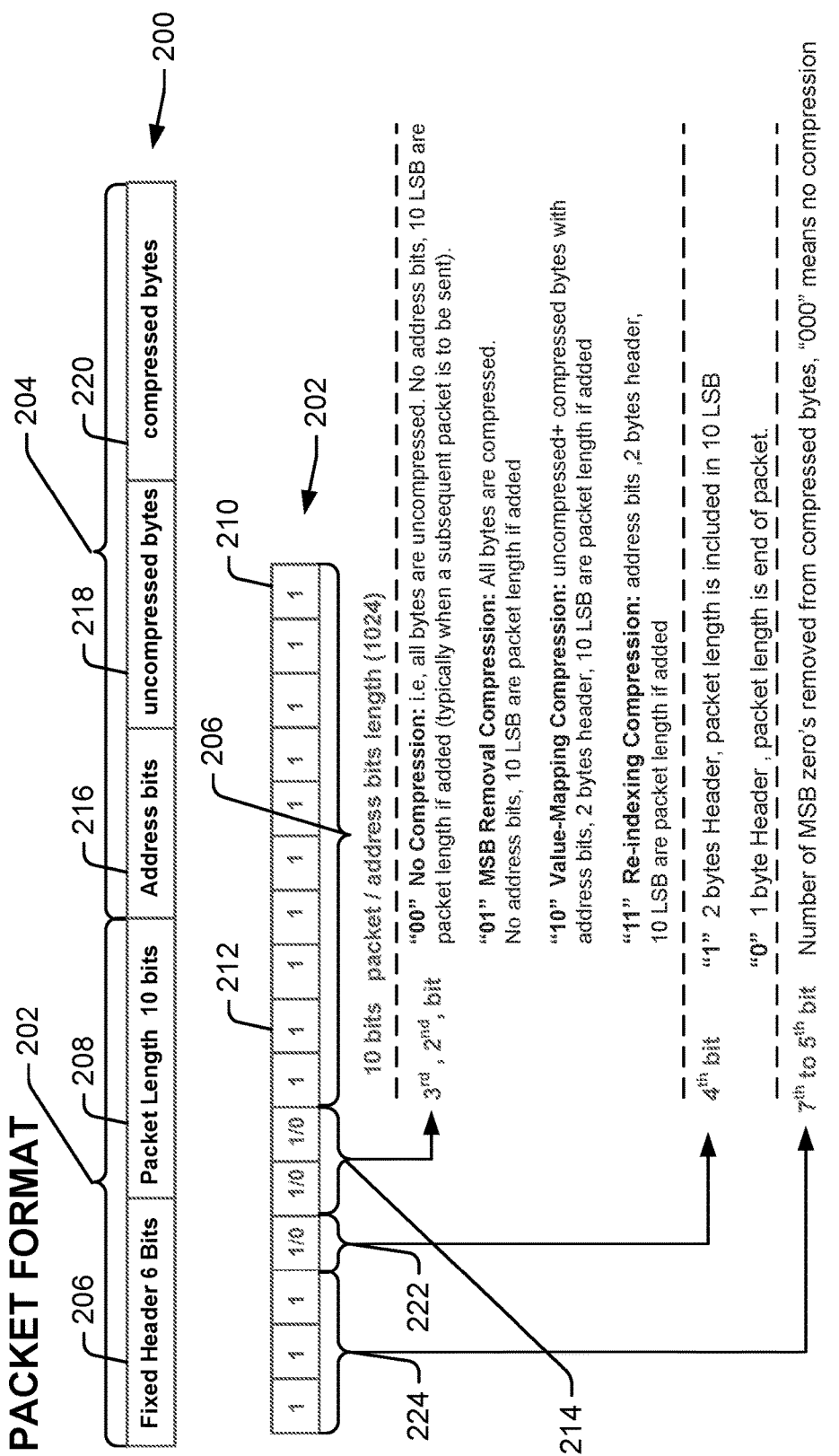
FIG. 2 is a diagram showing an example packet, illustrating aspects of data compression techniques to enhance network throughput and reduce energy consumption.

Because the index array has values that tend to be smaller than the first-instance array (which is typically true if small amounts of input data is compressed) then every byte in the index array may have two or more most significant bits (MSBs) that are zero-valued. These zeros may be removed from the index array, to compress the index array. The number of zeros removed is recorded in the packet header, and the index array is put into a location of "compressed bytes" as indicated by the header. The first-instance array is put into a location of "uncompressed bytes," e.g., as indicated by the example of FIG. 2.

Overview of "Value-Mapping" Compression

Further techniques for data compression for efficient network management are described herein. These techniques are particularly well-suited to data containing bytes having small values, e.g., large numbers of bytes all having two or more most significant bits (MSBs) that are zero-valued. In this second example of data compression, every input byte is stored in one of a "compressed-bytes array" or an "uncompressed-bytes" array. An address-bit array is configured with one bit for every byte of input data. In an example, if 64 bytes of input data are received, then the address-bit array will have 64 bits, i.e., 8 bytes. Each bit of the address-bit array will indicate whether an associated byte of input data was stored in the compressed-bytes array (e.g., based on a "1" in the address-bit array) or was stored in the uncompressed-bytes array (e.g., based on a "0" in the address-bit array).

The compressed-bytes array is compressed by removing as many zero-value most significant bits (MSBs) as are present in the largest value byte. For example, if three MSBs are zero for all values in the compressed-bytes array, then that would be indicated in the packet header (e.g., as seen in FIG. 2, the first three bits would be 011, to indicate three MSBs were removed from each byte in the compressed-bytes array). Accordingly, due to the compression (by removal of the MSBs of bytes in the compressed-bytes array) the overall size of the input data is reduced. In an example, if two MSBs are removed from each byte in the compressed-bytes array, and the compressed-bytes array included half the input data, that would compensate for the one-bit per byte overhead of the address-bit array. If three or more MSBs could be removed from each byte in such a compressed-bytes array, then the output data of the compression would occupy less memory space than the input data.

The compressed-bytes array will have the same number of zero-valued MSBs removed from each byte. Bytes of input data not having zeros in that number of MSBs will be placed in the uncompressed-bytes array. The number of bytes (before MSB removal) in the compressed-bytes array multiplied by the number of MSBs removed from each byte indicates the gross (before overhead, e.g., the address-bit array) number of bits saved by compression.

In an example, 64 bytes of input data are to be compressed before transmission. In the example, 30 bytes may have at least 3 zero-valued MSBs in all bytes. Additionally, 12 bytes may have at least 4 zero-valued MSBs in all bytes. In this example, the compressed-bytes array should include the 30 bytes of data, since that will result in 90-bits of removed MSBs, which is more than the 48-bits of removed MSBs offered by the alternative choice. Moreover, the 90-bits of removed MSBs exceeds the overhead of the 64 bits of the address-bit array. The address-bit array will indicate with ones (or zeros) which bytes' information was put into the compressed-bytes array, and will indicate with zeros (or ones) which bytes' information was put into the uncompressed-bytes array. Accordingly, the compressed-bytes array will include 5 significant bits of each byte in the "at least 3 zero-valued MSBs group" and will be more compact than if all 8 bits of the same bytes were in the array.

Example Systems and Techniques

Figure 1:
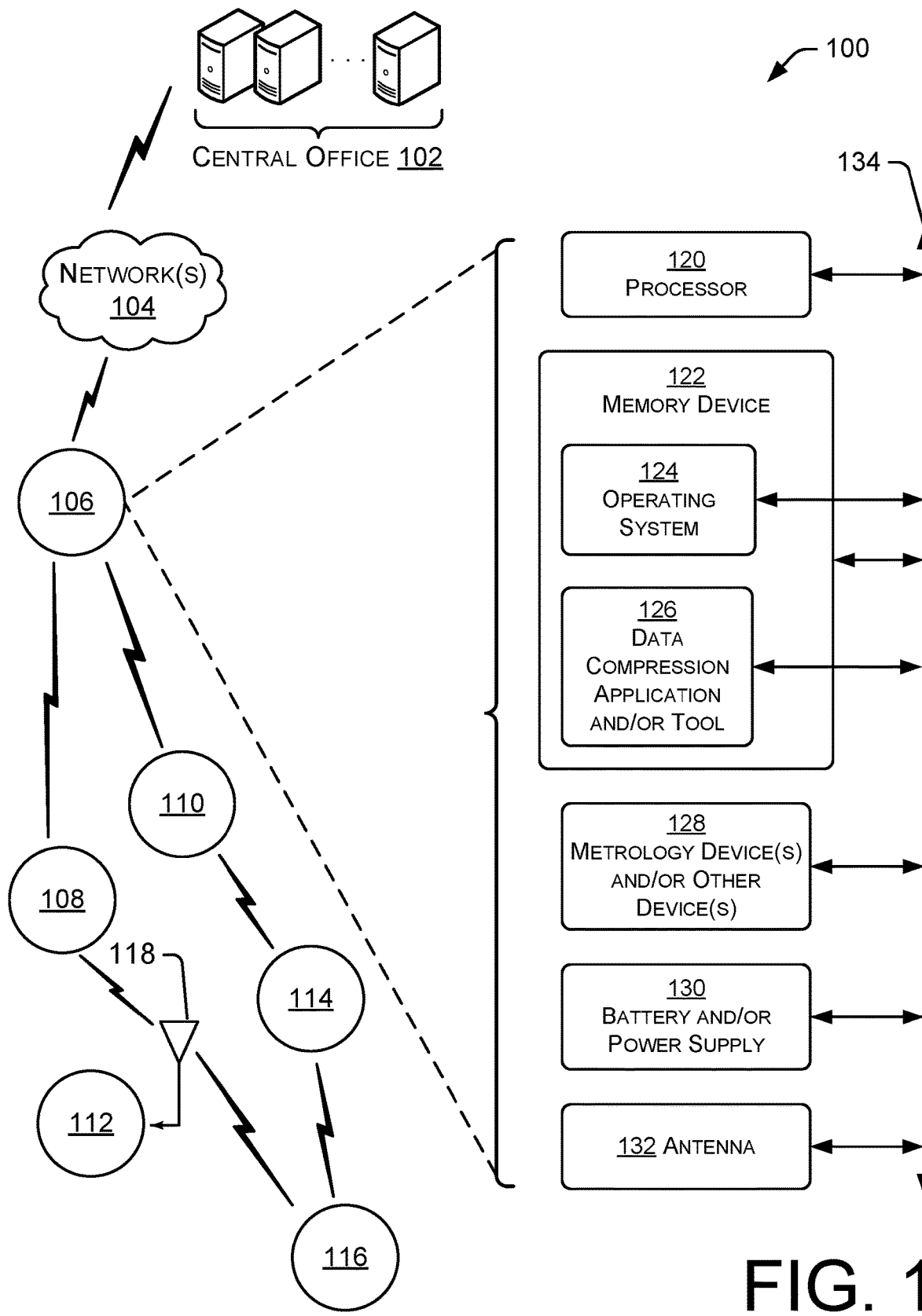
FIG. 1 is a block diagram showing an example network illustrating aspects of data compression techniques to enhance network throughput and reduce energy consumption.

FIG. 1 shows an example network 100 illustrating aspects of data compression techniques to enhance network data transmission efficiency and/or rates, to reduce bandwidth used, and to reduce energy consumed. A central office 102 may use one or more networks 104 to communicate with a plurality of networked devices 106-116. In the example shown, the networks 104 (shown as a generic cloud) may include one or more of the internet, a cellular network, a proprietary radio frequency (RF) network, a powerline communication network (PLC), or other network technology. In the example, a representative network device 112 includes an antenna 118, which may send, receive, and/or forward data in networks that include one or both of a "star" or "mesh" configuration.

Example detail of the network node 106 is shown. One or more processors 120 may communicate with one or more memory devices 122. An operating system 124 and a data compression application and/or tool 126 may be located on the one or more memory devices 122. The data compression application 126 may be configured to perform any or all of the compression, encoding, decompression, and/or decoding operations described herein. A metrology device 128 may be present if the node 106 is a gas, water, or electricity meter. A battery and/or power supply 130 may be configured to provide regulated voltage and/or current to the network node 106. An antenna 132 may assist with RF communications in a manner similar to antenna 118 of network node 112. A bus 134 is representative of one or more of communications busses, wired connections, printed circuit board electrical traces, etc., and provides connectivity as needed, depending on design requirements.

Example Packet and Packet-Header Designs

FIG. 2 shows an example packet 200 that illustrates aspects of data compression techniques to enhance network throughput and to reduce energy consumption and bandwidth utilization. The example packet 200 includes a packet header 202 and a packet payload 204.

In the example shown, the packet header 202 includes a "fixed header" 206 of 6-bit length and packet length data 208 of 10-bit length. The fixed header 206 is "fixed" in that it is typically present in the header 202, while the packet length data 208 is not present in the header under some circumstances. The fixed header 206 includes the six most significant bits of the first byte of the packet, while the zero and one bits of the first byte are part of the 10-bit packet length data 208. If the header 202 is formed of two bytes, then the zero-bits 210, 212 of the first two bytes of the header are part of the 10-bit packet length data 208.

The fixed header 206 includes 6-bits. The least significant two bits of the fixed header are the compression status bits 214. These two bits indicate which of four compression states are used. The below example indicates meaning for four different values, "00," "01," "10," and "11." The below discussion is an example, and is not meant to require that particular meanings must be associated with particular values, 00 through 11.

A "00" in the least significant bits 214 indicates all bytes are uncompressed. Because all bytes are uncompressed, no address array 216 is required to indicate, by each bit in the array, whether or not a corresponding byte is compressed. Similarly, no compressed bytes array 220 is present. A "01" in the least significant bits 214 indicates that all bytes are compressed. Because all bytes are compressed, no address array 216 is required, and the uncompressed data array 218 is not present. A "10" in the least significant bits 214 of the fixed header indicates that "value-mapping" compression is utilized, and that uncompressed bytes 218 and compressed bytes 220 are present. Accordingly, each bit in the address array 216 indicates (by "1" or "0") if a corresponding byte in the payload 204 should be added to, or taken from, the uncompressed bytes array 218 or the compressed bytes array 220. A "11" in the least significant bits 214 indicates that "re-indexing" compression is used and an address array 216 is similarly used.

Referring again to the condition wherein the compression status bits 214 are "01," this indicates that all bytes are compressed. In an example, each and every byte of the input data may have one or more most significant bits (MSBs) that are zero-valued. Accordingly, a number of MSBs that are zero-valued in each and every input byte may be removed from each and every input byte. This compresses the input bytes. Upon decompression, that number of zero-valued MSBs will be replaced. The number of zero-valued MSBs removed is stored in the first three bits 224 of the header.

In an example, if each and every input byte has 3 zero-valued MSBs, then the compression would involve removing 3 zero-valued MSBs from each input byte. The decompression would involve restoring the 3 zero-valued MSBs to each 5-bit chunk of data that was created by removing 3 zero-valued MSBs.

A "1" in the bit 222 indicates that the header 202 is two bytes in length and includes the packet length data 208, while a "0" in bit 222 indicates that the packet length data 208 indicates the end of the packet.

The three bits 224 indicate a number of zero-valued MSBs removed from the compressed bytes 220. A "000" indicates no compression was used. A "111" may indicate that seven zero-valued MSBs were removed from all bytes, or a "010" may indicate that two zero-valued MSBs were removed from all bytes. In an alternative example, the three bits may indicate the length of the data after removal of zero-valued MSBs. Either example is a workable design choice. Accordingly, when all bytes are compressed, or only some bytes are compressed (e.g., in value-mapping compression or in re-indexing compression) the three bits 224 can indicate the number of zero-valued MSBs that were removed, or the number of bits remaining after zero-valued MSBs were removed.

Example Methods

In some examples of the techniques discussed herein, the methods of operation may be performed by one or more application specific integrated circuits (ASIC) or may be performed by a general-purpose processor utilizing software defined in computer readable media. In the examples and techniques discussed herein, the memory may comprise computer-readable media and may take the form of volatile memory, such as random-access memory (RAM) and/or non-volatile memory, such as read only memory (ROM) or flash RAM. Computer-readable media devices include volatile and non-volatile, removable, and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transitory medium that can be used to store information for access by a computing device.

Accordingly, a processing unit may be configured to perform operations including data compression techniques to enhance network throughput. The processing unit can include a processor and local or remote memory, an FPGA, and/or one or more integrated circuits. Instructions to perform the operations can be stored in memory or implemented in hardware circuits.

Data Compression Using "Re-Indexing" Techniques

Referring to FIGS. 3 through 8, a goal is to achieve a large or maximal compression level. At FIG. 2, the bits 214 indicated that three types of compression were potentially available, the "01" option of all bytes compressed, the "10" option of "value-mapping" compression, and the "11" option of "re-indexing compression." In the event that sufficient memory (e.g., RAM) is not available to test the compression of one or more of these methods, and/or these compression methods fail to actually compress the data then the "00" option of no compression is used. The techniques discussed herein may calculate the final compressed data size by forming comparative packets, or portions thereof, associated with options "00" through "11" in location 214 of FIG. 2. Memory is not a concern in the case of the re-indexing algorithm since it will take a same amount of RAM as an input array. In contrast, the value-mapping algorithm includes memory-intensive (i.e., RAM-intensive) compression logic. Accordingly, some designs will not employ a value-mapping algorithm, and instead may employ a compression algorithm wherein a highest byte value is found, which indicates a number of zero-valued MSBs that may be removed from all input bytes. Accordingly, while value-mapping may have achieved a better result, other algorithms are better-suited in memory-constrained, processor-constrained, and/or battery power-constrained environments. If memory is not constrained, the algorithm(s) of FIGS. 3-8 will choose a best compression ratio after calculation value-mapping, re-indexing, and/or compression of all bytes by finding a highest byte value and removing an appropriate number of zero-valued MSBs. Thus, any combination of two or more of the four compression options associated with bits 214 of FIG. 2 may be performed, compared with other options, and a best option selected.

Figure 3:
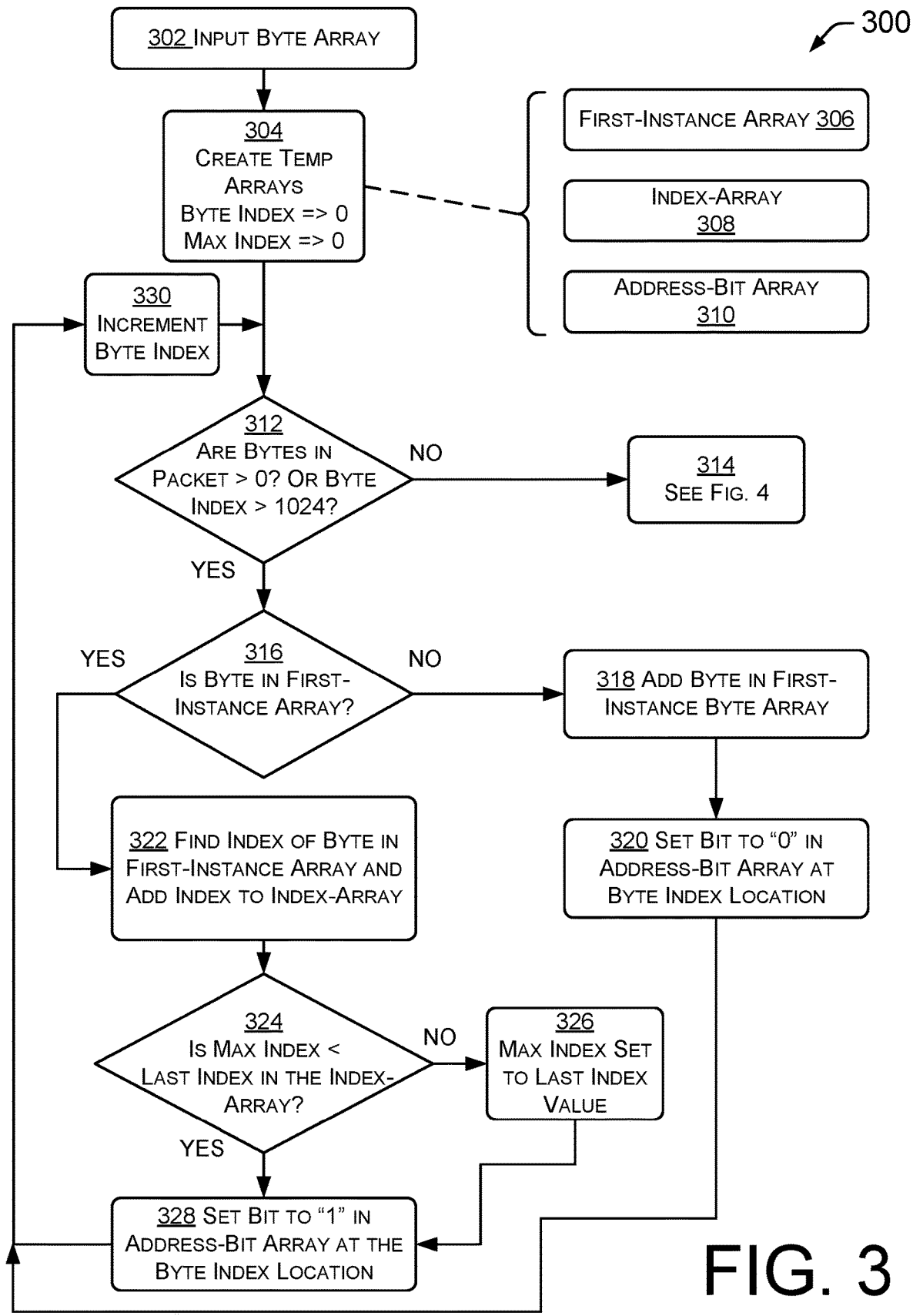
FIG. 3 is a flow diagram showing an example "re-indexing" data compression algorithm.
Figure 4:
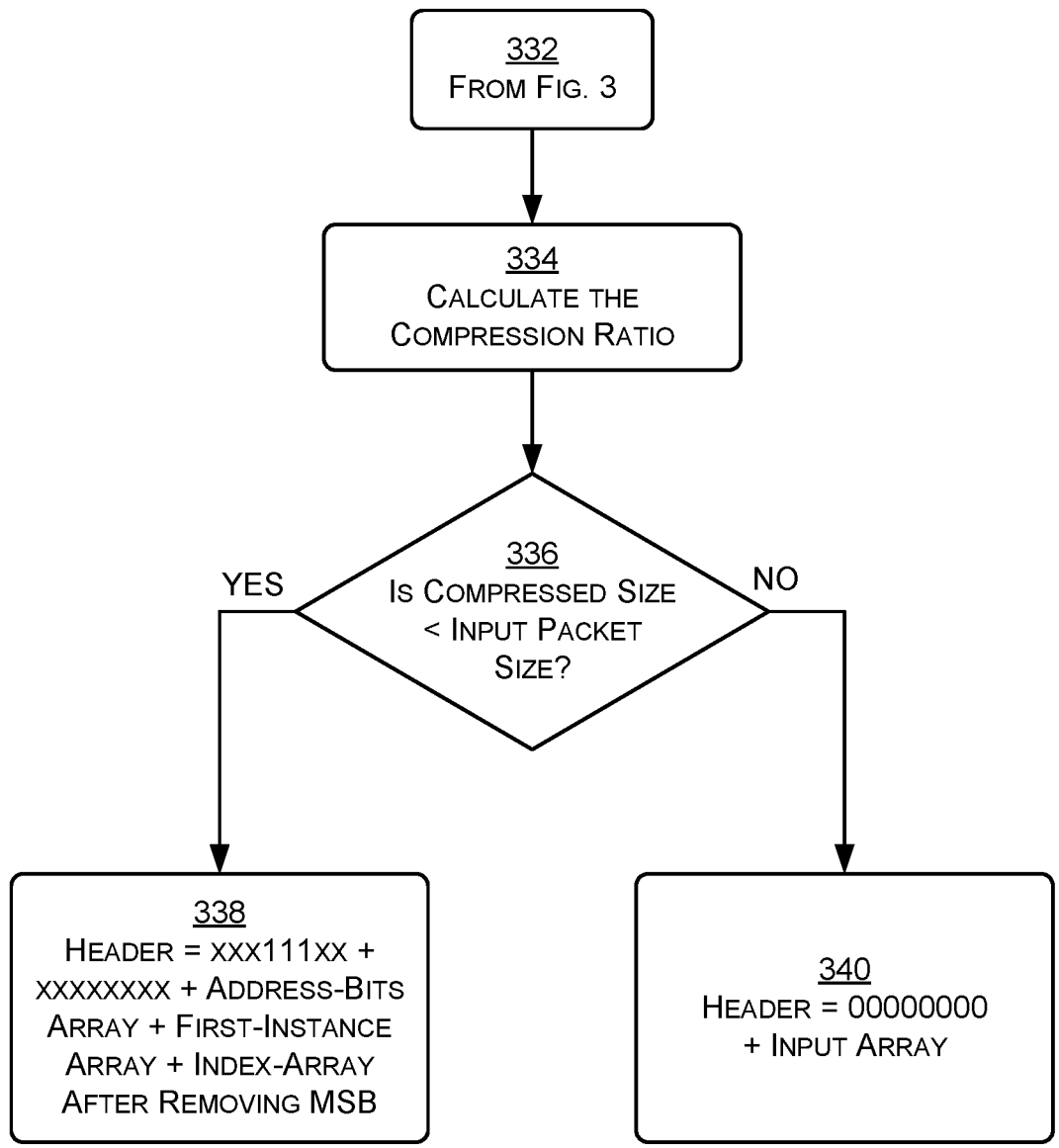
FIG. 4 is a flow diagram showing an example algorithm for determining if data compression was successful and would result in enhanced network throughput and reduced energy consumption.

FIGS. 3 and 4 show example methods, algorithms, and/or techniques for "re-indexing" type(s) of data compression. In an example, the information of input bytes of data is converted into a format including a first-instance array, an index array, and an address-bit data array. Removal of zero-valued MSBs from the index array results in compression of the data.

FIG. 3 shows an example method 300 for a "re-indexing" data compression algorithm. In the example method 300, input data to be compressed is received. For each byte of the input data (in the order it was received and/or the order in which it is organized in a data structure), it is determined if a value of the byte is distinct from other values in a first-instance array. The first byte of input data is always distinct since no other bytes have been received. If the value of the byte is distinct from other values in the first-instance array, then the byte is added (e.g., appended) to the first-instance array and a "0" is added to an address-bit array. If the value of the byte is not distinct from other values in the first-instance array, then an index value is added (e.g., appended) to an index array (such that the index value indicates a location of the value of the byte in the first-instance array) and a "1" is added to the address-bit array. (The "0" and the "1" could be reversed, if desired.) Accordingly, the first-instance array contains each of the byte values contained in the input data, while the index array contains pointers to how far into the array to look for "repeats" of those byte values.

To decode each byte of the compressed data, a corresponding bit in the bit-array indicates whether: (1) the first-instance array should be consulted to obtain a value of the byte; or (2) an index to the byte value should be obtained from the index array and the byte value should be obtained from the first-instance array using the index. Each time (1)

or (2) is performed, a pointer in the respective array is advanced to the next first-instance value or the next index-value, respectively.

At block 302, data to be compressed is received. The data may be in any format, such as a stream of data, a byte array, other data structure, etc.

At block 304, arrays are created, including a first-instance array 306, an index array 308, and an address-bit array 310. Pointers to locations in those arrays, including a byte index and a max index, may be set to a first location in each data structure.

At block 312, a check is made to determine if: (1) the bytes remaining in the input byte array is greater than zero, i.e., the check determines if there are any bytes left to compress, or (2) if the byte index is greater than 1024.

At block 314, if there are no further bytes in the input byte array, or if the byte index is greater than 1024, then the algorithm moves to FIG. 4 to determine if the compression was effective.

At block 316, a check is made to determine if the value of the current byte from the input data is already present in the first-instance array. If not, at block 318 the byte is added to the first-instance array. At block 320, a bit is set to "0" in the address-bit array at the next location. In the example of FIG. 2, the address-bit array 216 is updated to include the "0," i.e., a zero is put into the array at a location associated with the value of the first-instance array.

At block 322, if the byte to be compressed is found in the first-instance array then the index of the byte in the first-instance array is found and added to the index array. In an example, if the byte value was found in the third location of the first-instance array, then a three would be added to the index array.

At block 324, it is determined if the max index is less than the last index in the index array. If not, at block 326, the counter variable max index is set to the last index value. At block 328, a bit at the byte index location of the address-bit array is set to "1."

At block 330, the byte index value is incremented.

FIG. 4 shows a continuation of the example method 300, wherein it is determined if the data was compressed, and would therefore result in enhanced network throughput and reduced energy consumption. In some instances of input data, the method 300 may not be effective. This is particularly the case where each input byte is of different value and compression of the index array yields little if any benefit. In such instances, value-mapping compression may be utilized instead of re-indexing compression.

At block 332, the algorithm is entered from block 314 of FIG. 3, indicating that the conditions of block 312 are not met. At block 334, the compression ratio may be calculated.

At block 336, the size of the compressed data is compared to the size of the input data. A direct comparison may be made, or the compression ratio of block 334 may be utilized. The compressed data may include the first-instance array 306, the compressed index array 308 (having the same appropriate number of zero-valued MSB(s) removed from each byte), and the address-bit array 310. The input data may include the input byte array received at block 302.

Block 338 addresses the condition wherein the compressed size of the data was found to be less than the input data size, i.e., the compression did compress the data. The packet header is formed as indicated by FIG. 2 and associated discussion. The same appropriate number of zero-valued MSBs is removed from each byte in the index array, thereby compressing that array. The packet payload is formed, including the address-bit array, the first-instance array and the compressed index array.

Block 340 addresses the condition wherein the compressed size of the data was not found to be less than the input data size, i.e., the compression did not compress the data. Accordingly, at block 340 the packet header is formed of zeros, and the input data array is used as the payload.

In a first alternative, value-mapping compression may be applied to the input data in an attempt to compress the data.

In a second alternative, if each byte of the input data has at least a same number of zero-valued MSB(s), then that number of MSBs may be removed from all input data, according to the "all bytes compressed" option "01" seen at 214 in FIG. 2.

Data Compression Using "Value Mapping" Techniques

Figure 5:
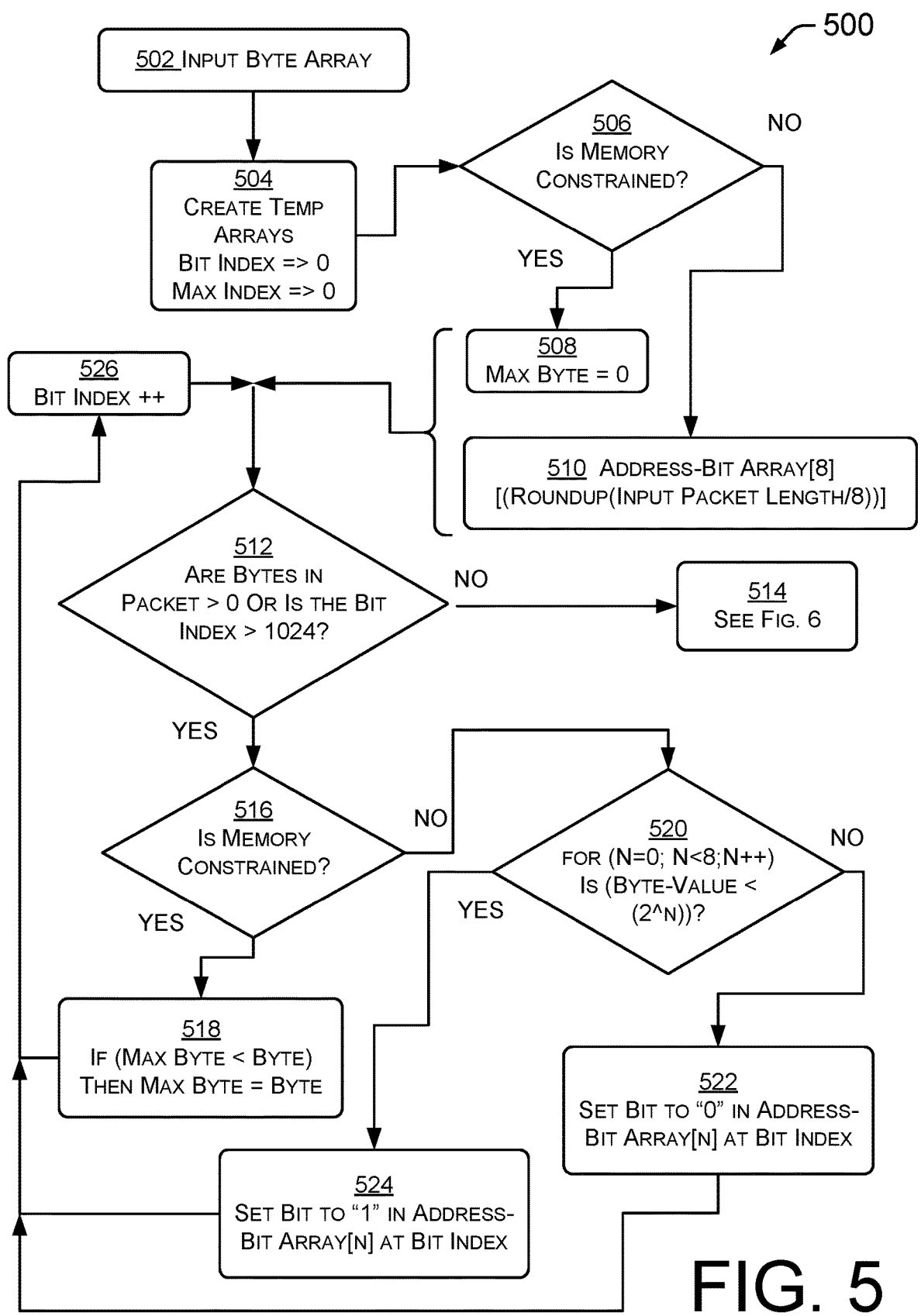
FIGS. 5 and 6 are flow diagrams showing an example algorithm for "value-mapping" data compression.
Figure 6:
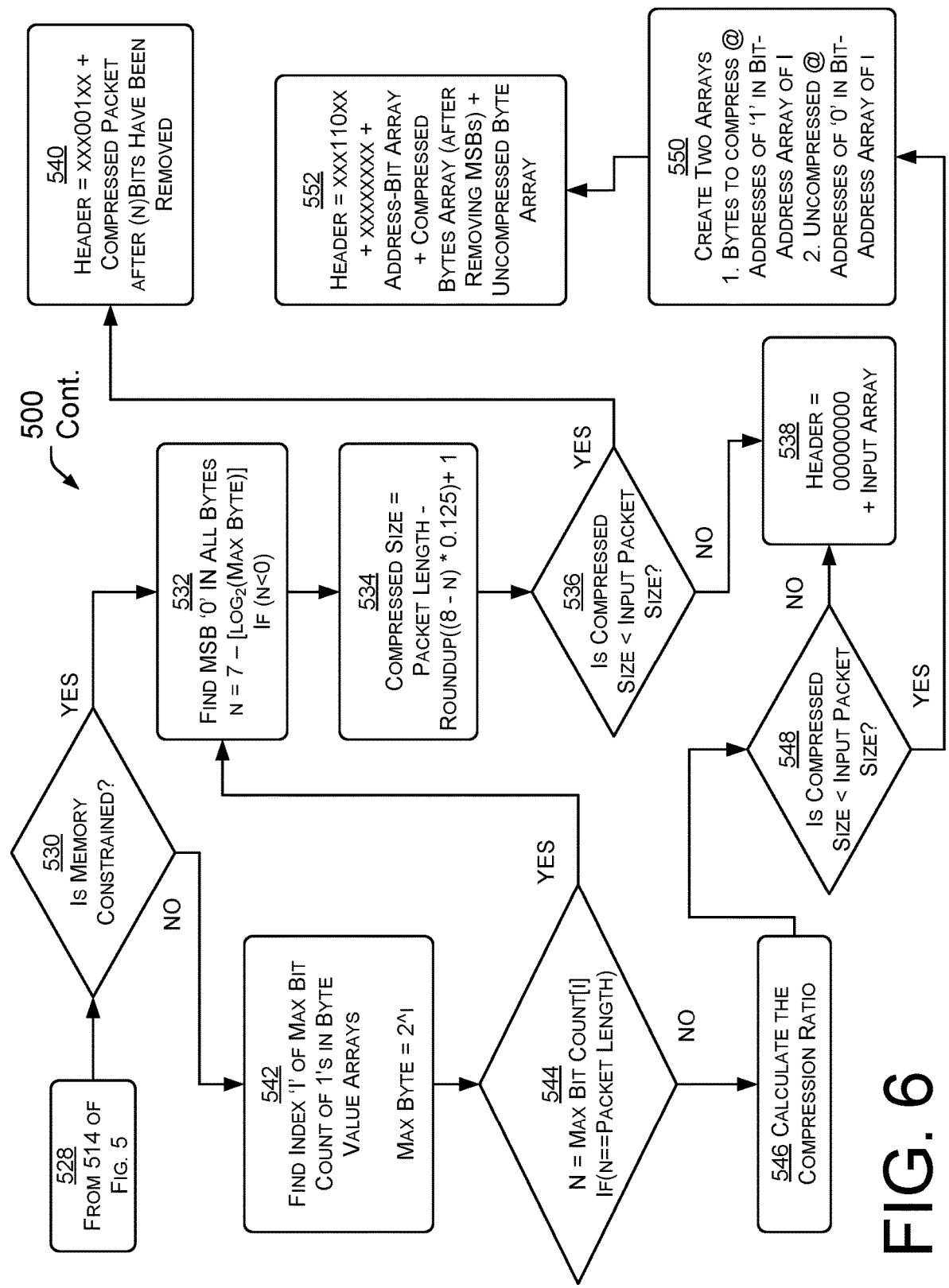

FIGS. 5 and 6 show an example method 500 (algorithms and/or techniques, etc.) for "value-mapping" data compression. In an example, the information of input bytes of data is converted into a group of bytes that are compressed and a group of bytes that are not compressed. An address-bit array uses one bit per byte of input data to indicate which array contains information from each byte of input data. The input bytes having more zero-valued MSBs are put into the compressed data array, while the input bytes having no and/or fewer zero-valued MSBs are put into the uncompressed data array. The bytes put into the compressed data array are compressed by removing a same number of zero-valued MSBs from each byte, thereby compressing the array. A number of algorithms are possible to determine if information from each byte of input data is put into the compressed data array or the uncompressed data array. Factors that may be considered include how many bytes of input data all have different numbers of zero-valued MSBs. While FIGS. 5 and 6 show considerable detail, all aspects of that detail are not required to implement versions and examples of the innovation as disclosed and claimed.

At block 502, data to be compressed is received. The data may be in any format, such as a stream of data, and/or other data structure, etc.

At block 504, temporary arrays are created, including a compressed-bytes array, an uncompressed-bytes array, and a bit-value array. Pointers, including a byte index pointer and a max index pointer are set to zero.

At block 506, it is determined if memory is constrained. If so, at block 508, a max byte variable is set to zero. If not, at block 510, a byte value array is created based at least in part on the input packet length. In the example, the address-bit array is set to the packet byte-length, divided by 8, and rounded up to the next value of 8 (i.e., rounded up to a full byte of data).

At block 512, it is determined if the bytes in the packet are greater than zero or the byte index is greater than 1024. That is, if the packet still contains data or if greater than 1024 bytes have been processed. If not, at block 514 the method continues in FIG. 6. If so, at block 516 it is determined if memory is constrained. If so, at block 518 if the byte value is greater than the max byte variable, then max byte is set to the byte value. Accordingly, the largest byte value seen is the value of max byte.

At block 520, in a loop from n=0 while n<8, it is determined if the byte value is less than $2^n$. If not, at block 522 set bit to "0" in the address-bit array at location n. Alternatively, at block 524, set bit to "1" in address-bit array at location n.

At block 526, the bit index is incremented. At some point, the result of block 512 will be no (e.g., when there are zero bytes left in the packet) and the method 500 will resume at block 528 of FIG. 6.

Referring to FIG. 6 at block 530, it is again determined if memory is constrained. If memory is constrained, at block 532 MSB "0" are found in all bytes n=7−[log$_2$(Max Byte)] if (n<0). At block 534, the compressed size variable is set to packet length−roundup((8−n)*0.125)+1. At block 536, it is determined if the compressed size is less than the input packet size. If not (i.e., the compression algorithm did not compress the data), then at block 538 the packet header is set to zeros (i.e., no compression) and the input array becomes the packet payload. If the algorithm did compress the data, then at block 540 the packet header is set with a "01" (at 214 in FIG. 2) to indicate that all bytes are compressed, and the compressed packet is put in the packet payload. Additionally, the 4th bit is set to zero (at bit position 222 of FIG. 2). The bytes compressed will have been compressed by removing the same n-number of zero-valued MSBs from each byte.

Returning to the condition of unconstrained memory at block 530, at block 542, the index "i" is found of the max bit count of ones in the byte value arrays, where max byte=2^i.

At block 544, if n is equal to the packet length, then the variable n is set equal to the max bit count[i].

At block 546, the compression ratio is calculated. At block 548, it is determined if the compressed size is less than the input packet size (i.e., if the compression algorithm successfully compressed the input data). If not, at block 538, the header is set to zeros and the input array is used at the payload data of the packet (i.e., no compression).

If the compression was successful in reducing the input data size, then at block 550 two arrays are created. A compressed-data array is configured with bytes associated with ones in the bit-address array. An uncompressed-data array is configured with bytes associated with zeros in the bit-address array.

At block 552, an output packet is created with "110" in the header at locations 222 and 214 (of FIG. 2), to indicate value-mapping compression. The payload of the packet includes the address-bit array, the compressed-bytes array, and the uncompressed-bytes array. The zero-valued MSBs are removed from the compressed bytes array to actually compress the data.

Example Data Decompression Methods, Algorithms, and Techniques

Figure 7:
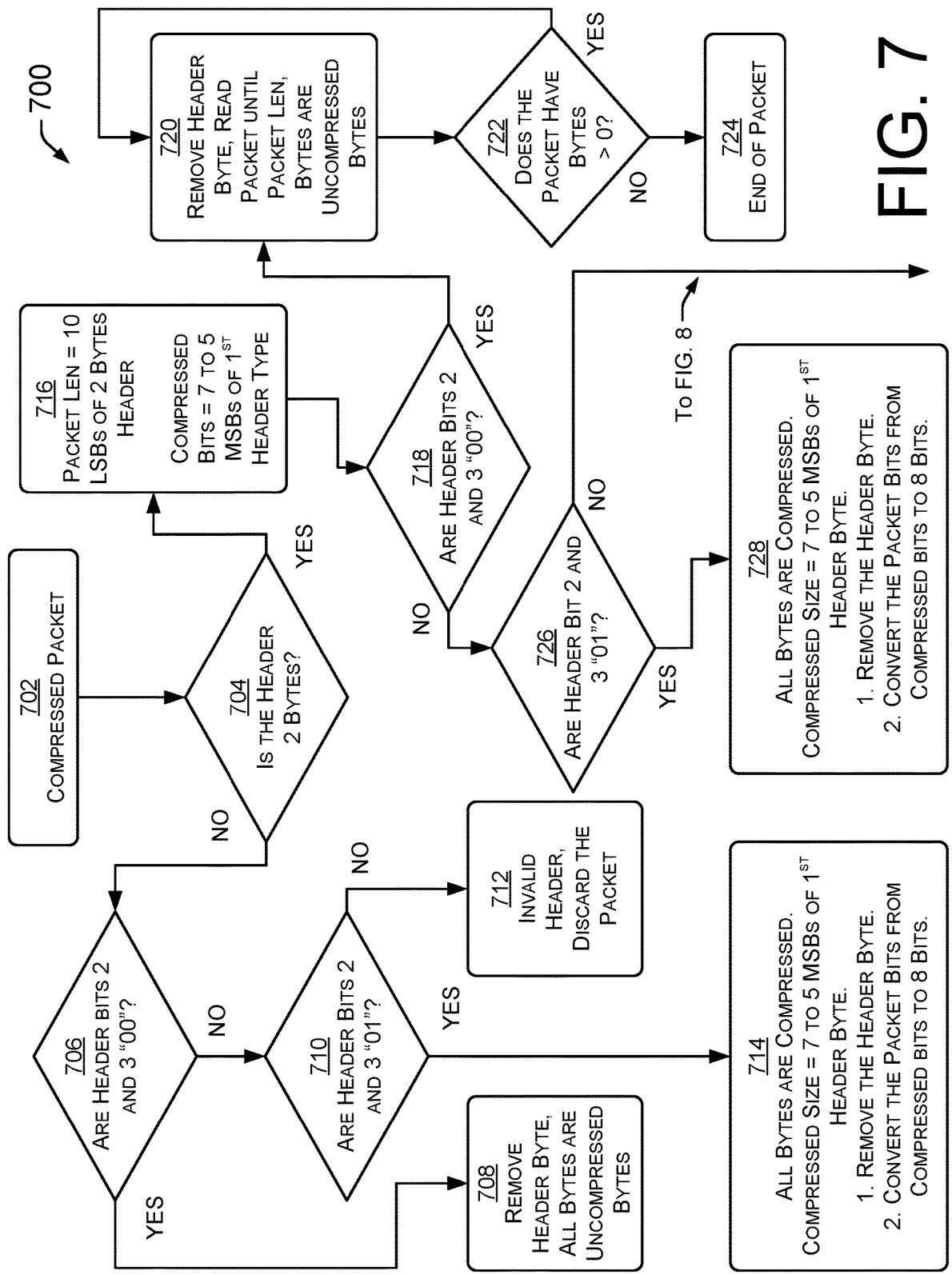
FIGS. 7 and 8 are flow diagrams showing an example algorithm for data decoding and/or decompression.
Figure 8:
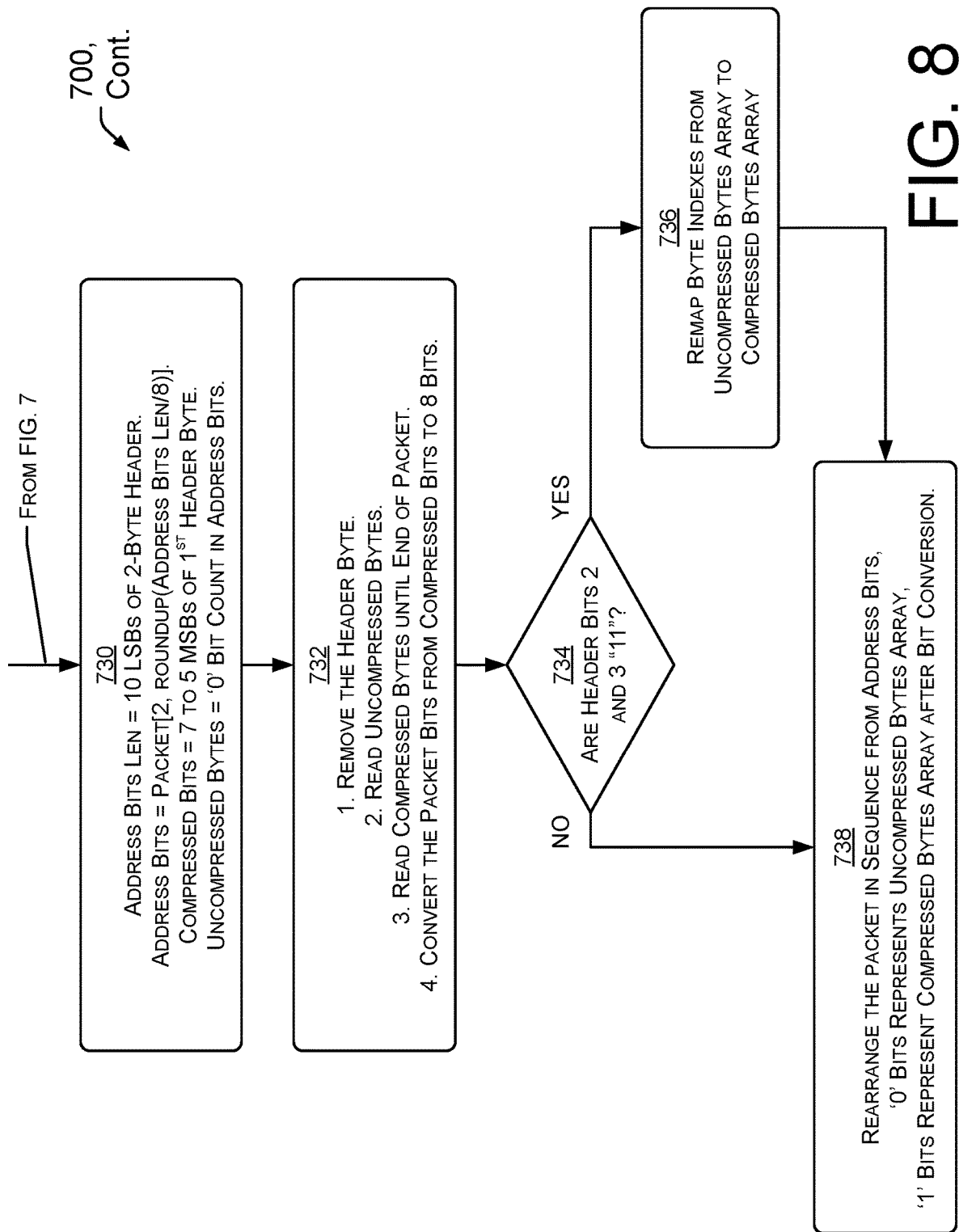

FIGS. 7 and 8 are flow diagrams showing an example method 700 for data decompression. The method 700 examines the bits 2 and 3 of the first byte of the packet header (labeled 214 in FIG. 2) to determine if they are: (1) a "00" indicating no compression of the input data; (2) a "01" indicating all bytes are compressed (e.g., a same number of zero-valued MSBs that were removed from all input bytes to compress the payload); (3) a "10" indicating "value-mapping compression; or (4) a "11" indicating "re-indexing" compression. Having determined a type of compression, the method 700 describes example decompression techniques.

At block 702, a packet is received for decoding and/or decompression.

At block 704, it is determined if the header of the packet is one or two bytes. In the example of FIG. 2, if the bit labeled 222 is a zero the header is one byte long, and if the bit is a one the header is 2 bytes long.

At block 706, it is determined if the header indicates "00," i.e., (in the example of FIG. 2) "no compression." At block 708, because the "00" indicates that there is "no compression," the header byte can be removed, and the uncompressed data is available.

A block 710, it is determined if the header indicates "01," i.e., (in the example of FIG. 2) "all compression." If not, at block 712 an error condition is indicated.

At block 714, the "01" in the header indicates all bytes are compressed. The compression of all bytes resulted from a same number of zero-valued MSBs being removed from all bytes. In the example of FIG. 2, the number of MSBs removed is indicated in the bits labeled 224, and may be from 1 to 7 bits. In an example, if the bits labeled 224 are "011," (i.e., a 3, in decimal) then the data has been compressed from 8-bit bytes to 5-bit data by removing three zero-valued MSBs. Accordingly, to obtain the uncompressed data, the header is removed and the appropriate number of zero-valued MSBs is added, to thereby restore the compressed data to full 8-bit bytes.

Referring again to block 704, if the header is two bytes long, then at block 716, the packet length is indicated in the ten least significant bits (LSBs) of the 2-byte packet header. Also, the number of zero-valued MSBs needed later in the decompression algorithm is indicated in the bits labeled 224 in the example of FIG. 2.

At block 718, it is determined if the header indicates no compression (e.g., with a "00" code). If there is no compression, at block 720 the header is removed. Byte by byte, in the loop of blocks 720 and 722, the uncompressed bytes are removed, until at block 724 the packet ends.

At block 726, it is determined if the header indicates that all bytes were compressed by removal of a same number of zero-valued MSBs from all bytes. At block 728, because all bytes were compressed the appropriate number of zero-valued MSBs are restored to the compressed data (e.g., as seen in block 714).

Referring to FIG. 8, blocks 718 and 726 of FIG. 7 removed the options of no compression (the "00" code of bits 214 of FIG. 2) and all bytes compressed (the "01" code). Accordingly, FIG. 8 shows an example method for decompressing code "10" (value-mapping compression) and code "11" (re-indexing compression).

At block 730, the address bits length is described by the 10 least significant bits 206 of the 2-byte header. The address-bit 216 (one bit for each byte of input data) indicate a sequence of compressed data and compressed data present in the input data. A "0" address bit indicates an uncompressed byte in the input data and a "1" address bit indicates a compressed byte in the input data. The compressed data had a number of zero-valued MSBs removed that is indicated by bits 224 of FIG. 2.

At block 732, the header is removed, the uncompressed data are read or input, the compressed data are read or input, and the compressed data are decompressed. The decompression is performed by restoring the zero-valued MSBs.

At block 734, the "yes" indicates re-indexing compression and the "no" indicates value-mapping compression. At block 736, the values from the index array are used as pointers to values in the first-instance array. Thus, each index value may be replaced by a value from the first-instance array.

At block 738, an uncompressed array of data is therefore obtained (the first-instance array of re-indexing compression, and the uncompressed array of value-mapping compression). Also, formerly compressed array of data is obtained (the index array of re-indexing compression and the compressed array of value-mapping compression). Additionally, the address-bit array is obtained. By looking at the value of each bit in the address-bit array, data is obtained from the uncompressed array and the formerly compressed array in an order that results in recreation of the data before compression.

Further Examples of "Re-Indexing" Techniques

FIGS. 9-15 show further example methods, algorithms, and/or techniques for "re-indexing" types of data compression that use a first-instance array, an index array, and an address-bit data array.

Figure 9:
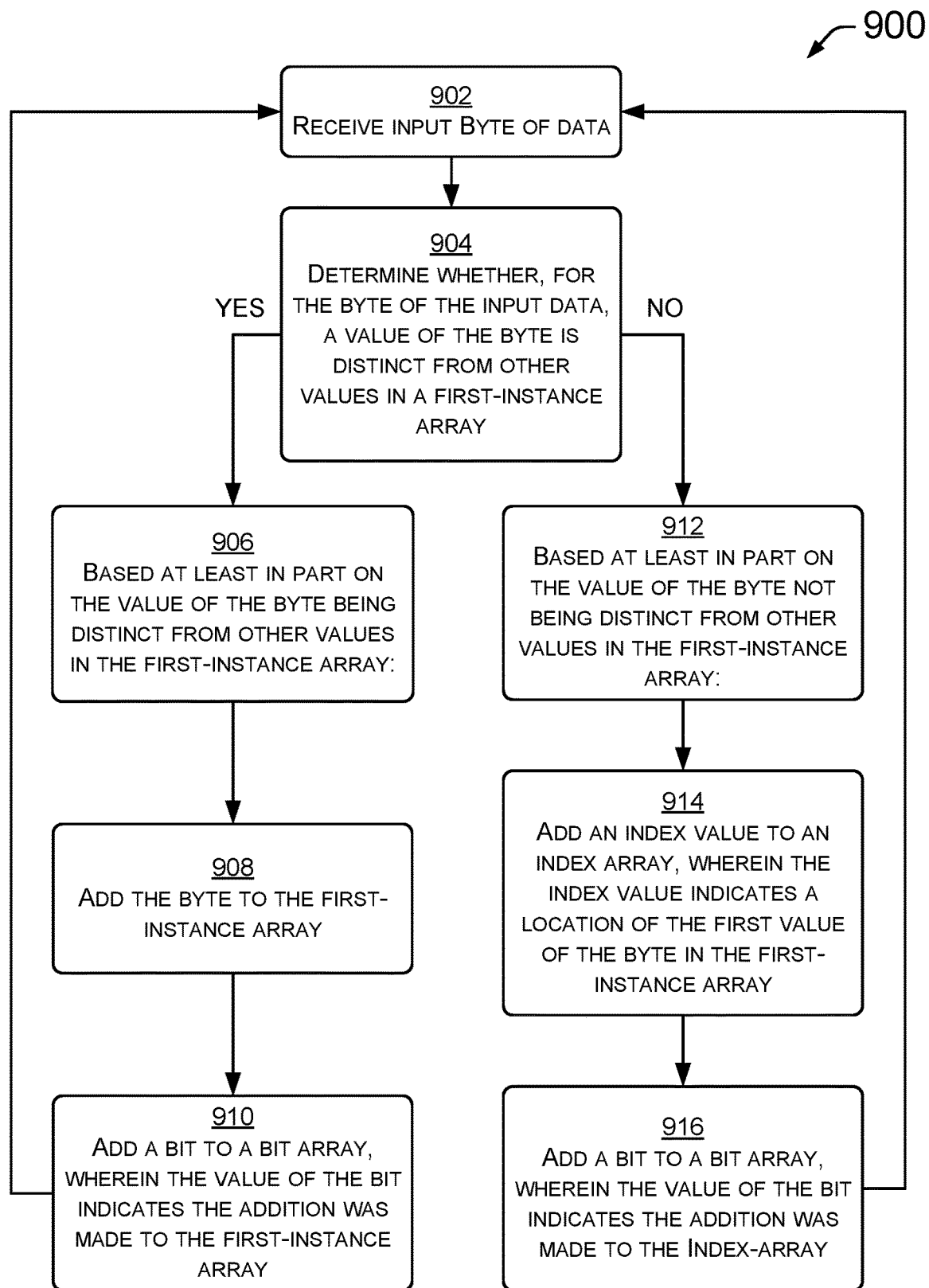
FIG. 9 is a flow diagram showing an example algorithm for data compression using a re-indexing algorithm.

FIG. 9 shows an example algorithm 900 for data compression. The algorithm 900 is similar to the algorithm 300, discussed at FIGS. 3 and 4. The compression technique may be considered "re-indexing," although the techniques, and not the name, are determinative. For every byte of input data, if a value of the byte has not yet been seen, it is added to the first-instance array, and a bit of the address-bit array is set to indicate that action. If a value of the byte has previously been seen, an address (e.g., a pointer) to that byte value within the first-instance array is added to the index array, and a bit of the address-bit array is set to indicate that action.

At block 902, input data is received. The data may be received as a data structure (e.g., an array), as a data stream, or by other means.

At block 904, it may be determined whether, for a byte of the input data, the value of the byte is distinct from values (if any) already located in a first-instance array. Accordingly, it is determined if the value of the byte of input data has been previously received (in the current batch of data to be compressed).

At block 906, based at least in part on the value of the byte being distinct from other values in the first-instance array, two actions may be taken. At block 908, the byte is added to the first-instance array. For example, the byte may be appended to the end of the array and/or added to the next empty data location. At block 910, a bit may be added to an address-bit array, wherein a value of the bit indicates the addition to the first-instance array. In contrast, adding a bit of a different value to the address-bit array would indicate that a value was added to the index array.

At block 912, based at least in part on the first of the byte not being distinct from other values in the first-instance array, two actions may be taken. At block 914, an index value is added to an index array, wherein a value of the bit indicates a location of the value of the byte in the first-instance array. At block 916, a bit may be added to an address-bit array, wherein a value of the bit indicates the addition to the index array. Accordingly, the bit is a different value than the bit added at block 910.

Figure 10:
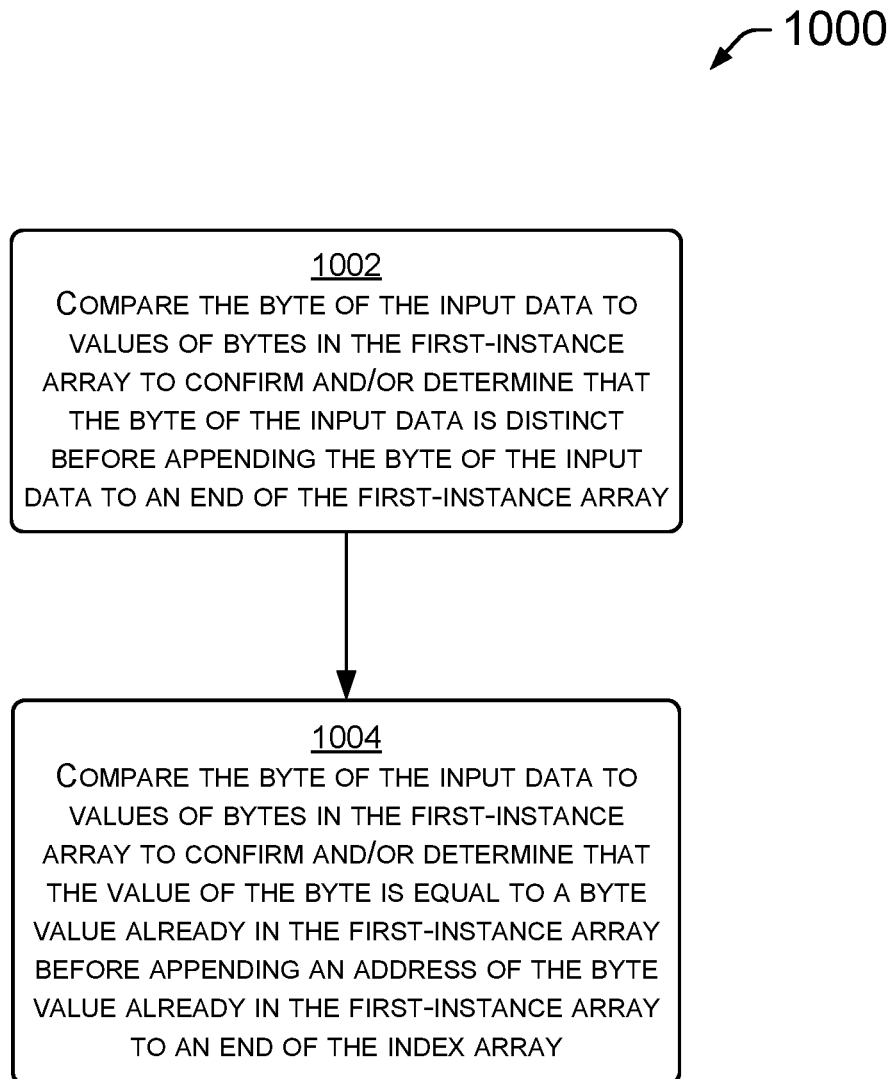
FIG. 10 is a flow diagram showing an example algorithm that builds a first-instance array and an index array as a part of the re-indexing algorithm.

FIG. 10 shows an example algorithm 1000 that builds a first-instance array and an index array. The first-instance array contains a copy of the first-instance of each of the byte values in the input data in the order in which the first-instances of the values were encountered. The index array contains pointers to locations in the first-instance array associated with input bytes having values that were present in previously obtained input data. An address-bit array has one bit for every byte in the input data. In an example, a "0" in (for example) the fifth location in the address-bit array indicates that the fifth byte of input data had a value not previously seen in the input data, and that that value is stored in the next location of the first-instance array. A pointer of the first-instance array increments as the first-instance array is accessed, to thereby track the "next" value. To continue the example, a "1" in (for example) the next location in the address-bit array indicates that the eighth byte of input data had a value that was previously seen in the input data, and that the "next" entry in the index array is the value that points to that value in the first-instance array. A pointer of the index array increments as the index array is accessed, to thereby track the "next" value.

At block 1002, the byte of the input data is compared to values of bytes in the first-instance array to confirm that the byte of the input data is distinct (i.e., the byte value is not already in the first-instance array) before appending the byte of the input data to an end of the first-instance array and/or into a first unused data slot in the array.

At block 1004, the byte of the input data is compared to values of bytes in the first-instance array to confirm that the value of the byte is equal to a byte value already in the first-instance array. Upon making the confirmation, an address of the byte value already in the first-instance array is appended to an end of the index array.

Figure 11:
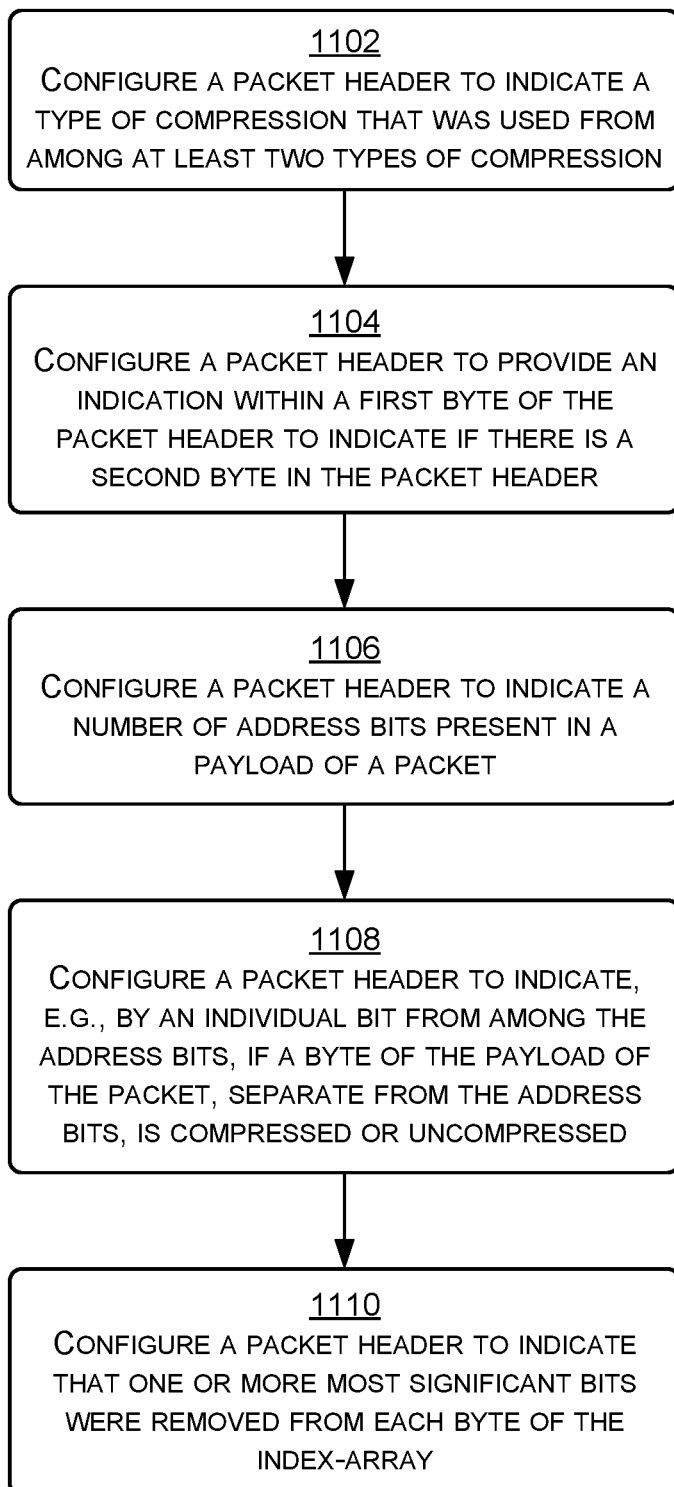
FIG. 11 is a flow diagram showing an example algorithm that configures a packet header.

FIG. 11 shows an example algorithm 1100 that expresses a number of techniques. A packet header may include some or all of the features of the packet header 202 of FIG. 2, and some or all of the techniques discussed with respect to FIG. 11. The particular format of the example header, such as which bits are used for particular functions, is not required. The format may be arranged as indicated by design requirements and/or by selection between equivalent workable sequences of the bits. Accordingly, one or more of the blocks in the algorithm 1100 may be utilized in the configuration of a packet header.

At block 1102, a packet header is configured to indicate a type of compression that was used from among at least two types of compression.

At block 1104, a packet header is configured to provide an indication within a first byte of the packet header to indicate if there is a second byte in the packet header.

At block 1106, a packet header is configured to indicate a number of address bits present in a payload of a packet.

At block 1108, a packet header is configured to indicate, by an individual bit from among the address bits, if a byte of the payload of the packet (optionally separate from the address bits), is compressed or uncompressed.

At block 1110, a packet header is configured to indicate that one or more most significant bits were removed from each byte of the index array.

Figure 12:
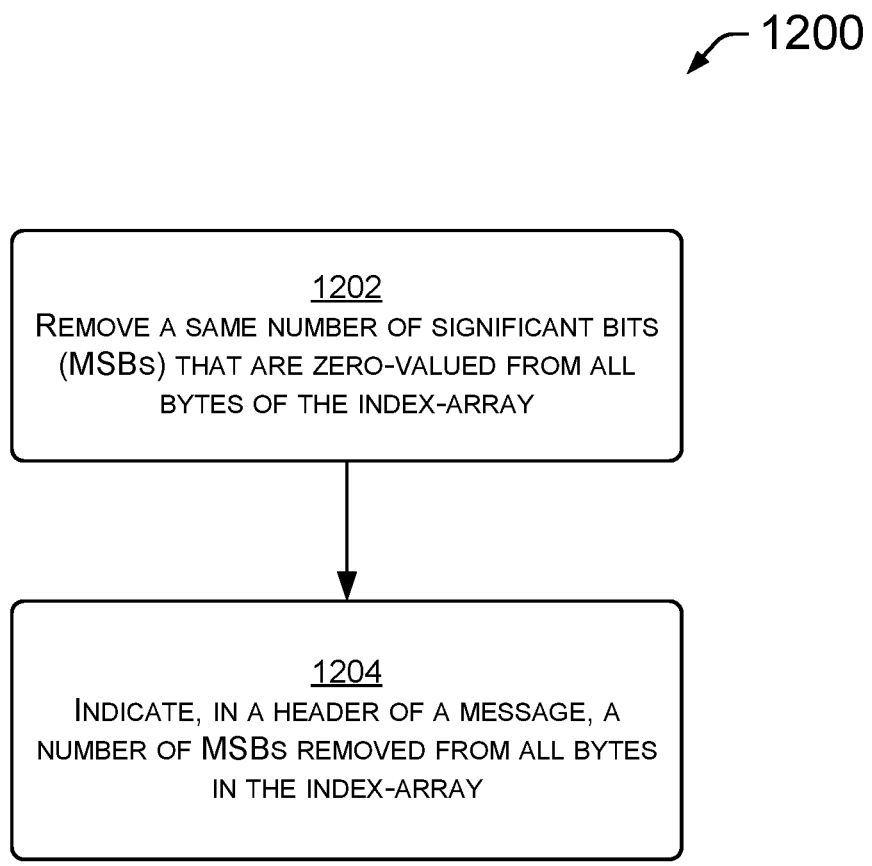
FIG. 12 is a flow diagram showing an example method that compresses data by removing a same number of most significant bits from all bytes of the index array and a method for recording in a packet header the number of bits removed per byte.

FIG. 12 shows an example algorithm 1200 that compresses data by removing most significant bits (MSBs). In an example, if all of the bytes in a particular array, data structure, packet, etc., are zero, then removing those bytes reduces the size of the data. The method may also include techniques for recording such actions in a packet header in a manner that allows the bytes, with the removed MSBs restored, to be recovered.

At block 1202, one or more most significant bits (MSBs) that are zero for all bytes of the first-instance array, the index array, and/or any data in a packet or data structure may be removed.

At block 1204, a number of MSBs removed from bytes (e.g., all bytes) in the first-instance array, the index array and/or any data in the packet or a data structure may be indicated in a header of the message having data from which the MSBs were removed.

Figure 13:
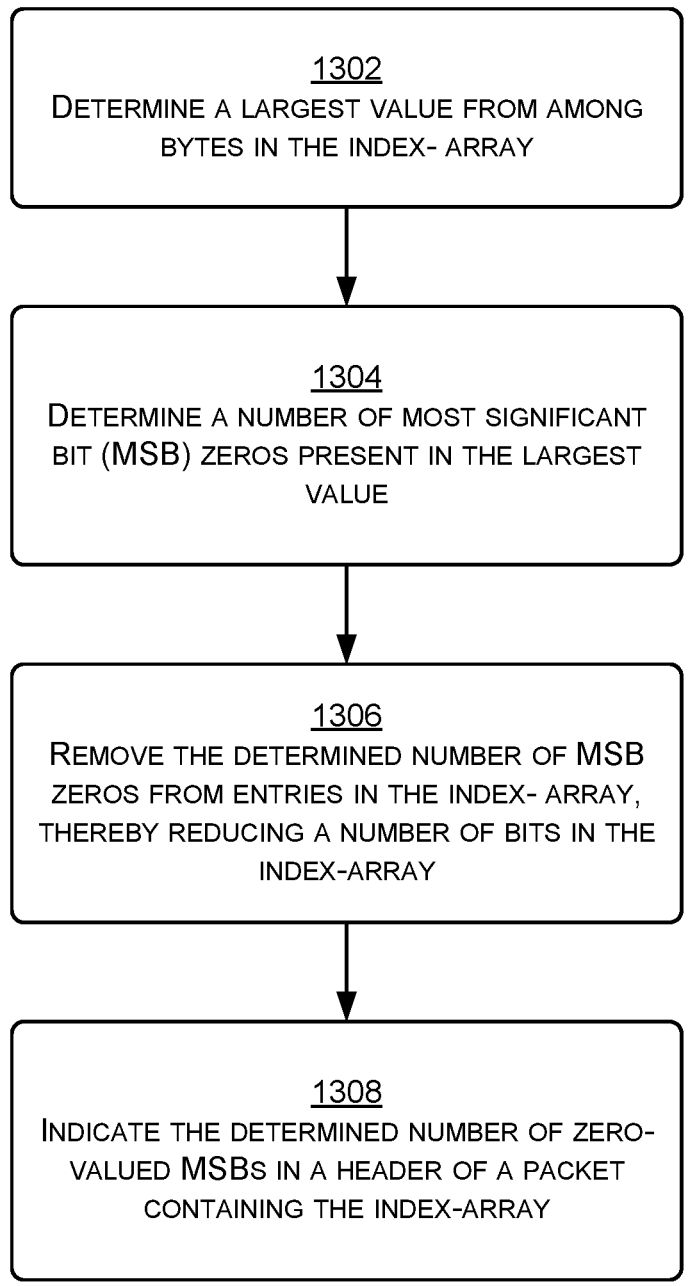
FIG. 13 is a flow diagram showing a further example algorithm that compresses data by removing most significant bits (MSBs) and that configures a packet header in response.

FIG. 13 shows a further example algorithm 1300 that compresses data by removing MSBs and configures a packet header in response. At block 1302, a largest value from among bytes in an index array, a distinct-values array, other data structure, or all or part of a packet payload is determined. At block 1304, a number of zero-valued MSBs present in the largest value (within the index array, distinct-values array, data structure, or packet payload) is determined. At block 1306, the determined number of zero-valued MSBs is removed from entries in the index array (and/or distinct-values array, data structure, or packet payload), thereby reducing a number of bits in the index array. At block 1308, the determined number of zero-valued MSBs and location(s) from which they were removed is indicated in a header of a packet containing the index array.

Figure 14:
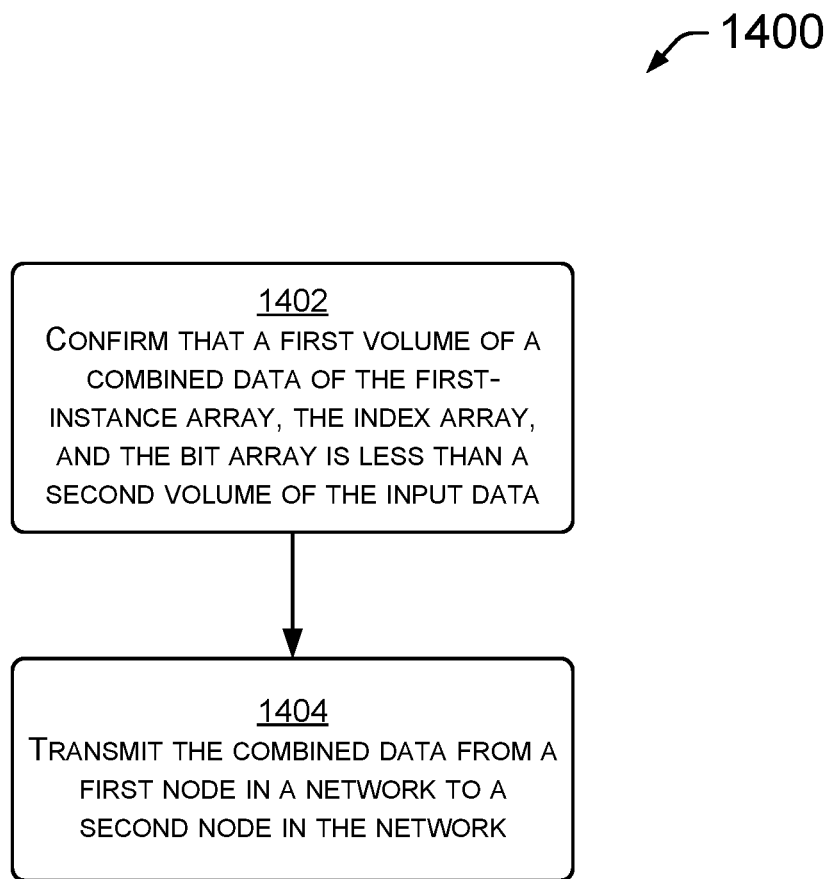
FIG. 14 is a flow diagram showing an example algorithm that determines if compressed or uncompressed data should be transmitted.

FIG. 14 shows an example algorithm 1400 that determines if compressed or uncompressed data should be transmitted. Generally, if the compression techniques resulted in less data, the compressed data should be transmitted. However, a threshold compression ratio (e.g., reduction to 80% or less of original data size) may be required, to overcome the costs of data decompression in an overall cost/benefit calculation.

At block 1402, it is confirmed that a combined data of the first-instance array, the index array, and the address-bit array (which constitute the compressed data) is less than a second volume of the uncompressed input data. At block 1404, the combined data (i.e., the compressed data) from a first node in a network is transmitted to a second node in the network.

Figure 15:
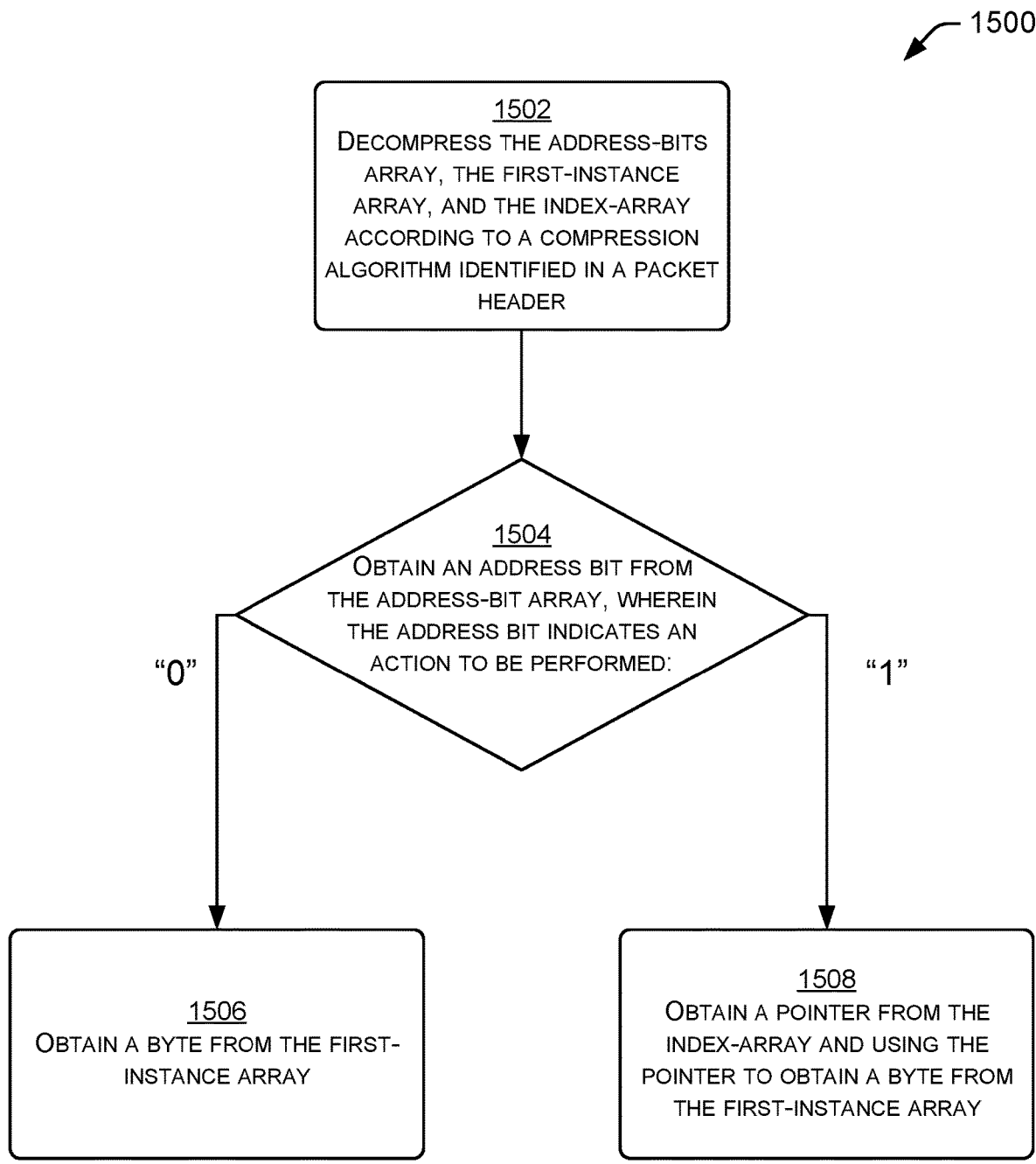
FIG. 15 is a flow diagram showing an example algorithm that utilizes address bits to decompress data.

FIG. 15 shows an example method 1500 that utilizes address bits and/or an address-bit array to decompress data.

At block 1502, a compression algorithm is identified in a packet header. In an example, the packet header may indicate that a "re-indexing" form of compression is to be used, including an address-bit array, a first-instance array, and an index array that are to be decompressed.

At block 1504, an address bit is obtained from the address-bit array. The address bit indicates an action to be performed. In an example (which could be reversed), if the bit is a "0" the actions of block 1506 are performed, and if the bit is a "1" the actions of block 1508 are performed.

At block 1506, a byte is obtained from the first-instance array. The first-instance array will have a pointer to a particular byte, which is obtained. The pointer is then incremented to the next location in the first-instance array.

At block 1508, an index or pointer is obtained from the index array, at a location in the index array that is indicated by the index array's own pointer. The obtained index or pointer is then used to obtain a byte from the first-instance array that is pointed to by the obtained index or pointer. For example, if the index or pointer obtained from the index array has a value of 18, then the data in the 18th location in the first-instance array is obtained.

The blocks 1504-1508 may be repeated for each bit in the address-bit array. The number of bits in the address-bit array is equal to the combined number of bytes in the first-instance array and the index array. Since the first byte of incoming data to be compressed is always a first-instance of that value, the number of bits can be reduced by one (but may require more complex programming).

Further Examples of "Value Mapping" Techniques

Figure 16:
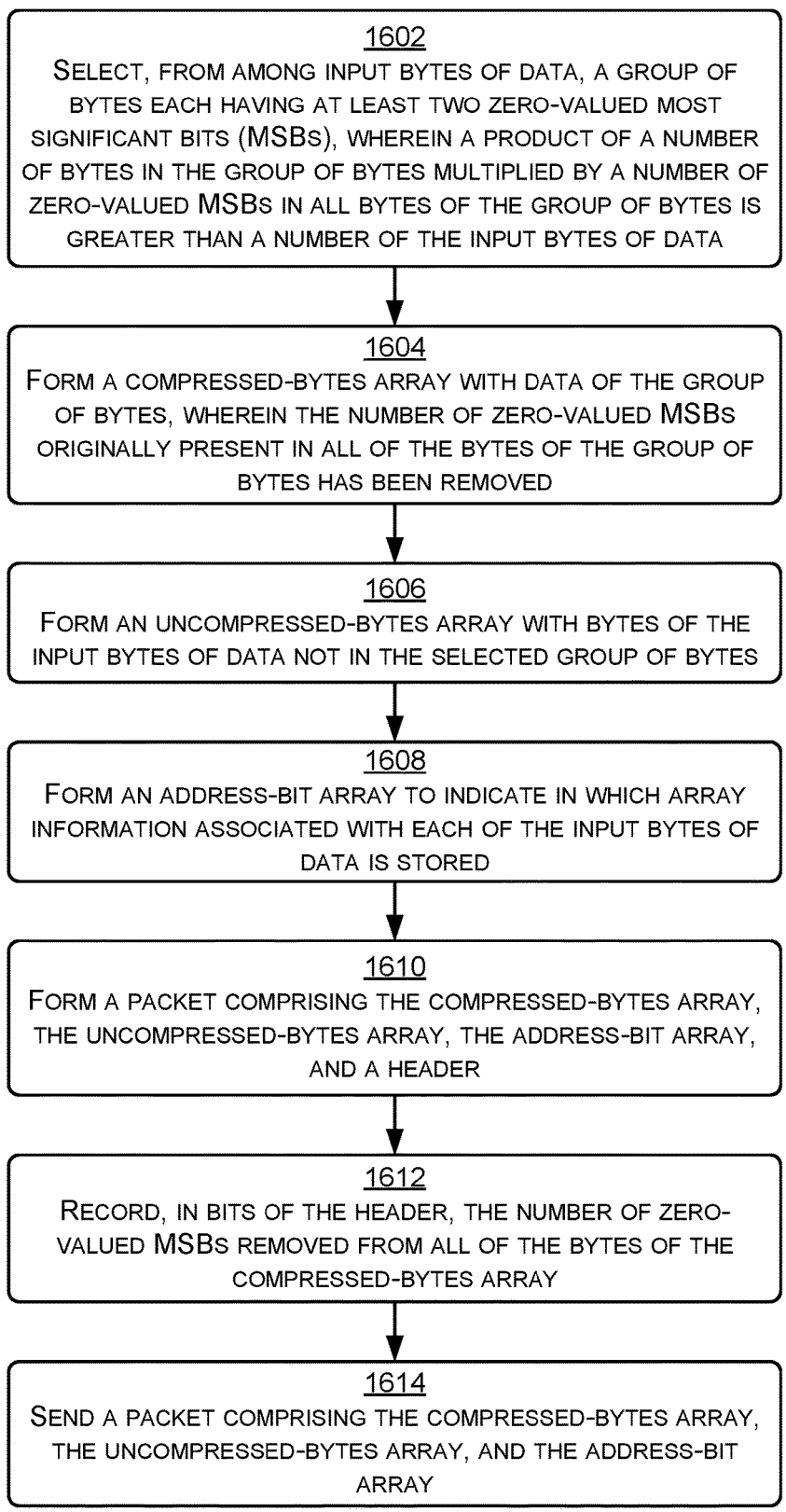
FIG. 16 is a flow diagram showing an example method to compress data using a value-mapping algorithm.

FIG. 16 shows an example method 1600 to compress data using a value-mapping algorithm. In one example, group(s) of bytes are formed from among input bytes to be compressed. The groups may be formed by including bytes having at least a certain number (e.g., three) zero-valued most significant bits (MSBs). A byte of input data having several zero-valued MSBs may be in several groups. A group having a product (number of bytes in the group times number of zero-valued MSBs in all bytes in the group) that is larger than the products associated with other groups may be selected. A compressed-bytes array may be formed with data of the selected group of bytes, wherein the number of zero-valued MSBs originally present in all of the bytes of the group of bytes has been removed (to compress the array). An uncompressed-bytes array may be formed with bytes of the input bytes of data not in the selected group of bytes. An address-bit array may be formed so that each bit in the array indicates a location of data associated with each respective byte of the input bytes of data.

At block 1602, a group of bytes each having at least two zero-valued most significant bits (MSBs) is selected from among input bytes of data. The selection is characterized in that a product of a number of bytes in the group of bytes multiplied by a number of zero-valued MSBs in all bytes of the group of bytes is greater than a number of the input bytes of data. The address-bit array includes one bit for each byte of input data. Accordingly, for the compression to result in a smaller number of bytes, at least two zero-valued MSBs must be present in (and removed from, in the compression) at least half the bytes of input data.

At block 1604, a compressed-bytes array is formed with data of the group of bytes. To compress the compressed-bytes array, the number of zero-valued MSBs originally present in all of the bytes of the group of bytes is removed.

At block 1606, an uncompressed-bytes array is formed, including bytes of the input bytes of data not in the selected group of bytes. The uncompressed-bytes array is formed with the bytes not having the requisite number of zero-valued MSBs. Additionally, the array is formed to include bytes in the relative order of the input bytes. That is, if a first byte was in an earlier position in the input data than a second byte, the first byte is in an earlier position in the uncompressed-bytes array.

At block 1608, an address-bit array is formed to indicate in which array information associated with each of the input bytes of data is stored. In an example, the address-bit array includes one bit associated with each byte of input data. Each address bit has the same location in the address-bit array as the location of its associated byte in the input data. In an example, if the address bit is a zero, then information from the associated byte in the input data is located in the compressed-bytes array, and if the address bit is a one, then information from the associated byte in the input data is located in the uncompressed-bytes array. This could be reversed, if desired.

At block 1610, a packet is formed to include the compressed-bytes array, the uncompressed-bytes array, the address-bit array, and a header. In an example, the packet may have features similar to those described with respect to FIG. 2.

At block 1612, the number of zero-valued MSBs removed from all of the bytes of the compressed-bytes array may be recorded in the header of the packet. Recording the number of zero-valued MSBs removed from all bytes conveys the same information as (and therefore may be considered the same as) recording a length of the data associated with each byte of input data. Thus, recording that three zero-valued MSBs were removed is the same as recording that five bits are used to represent the data of each byte after compression.

At block 1614, a packet may be transmitted from one network node to another node. Because the data in the packet is compressed, use of battery power, radio frequency (RF) bandwidth, and time of transmission are all lessened. In an example, the packet may include a header, the compressed-bytes array, the uncompressed-bytes array, and the address-bit array.

Figure 17:
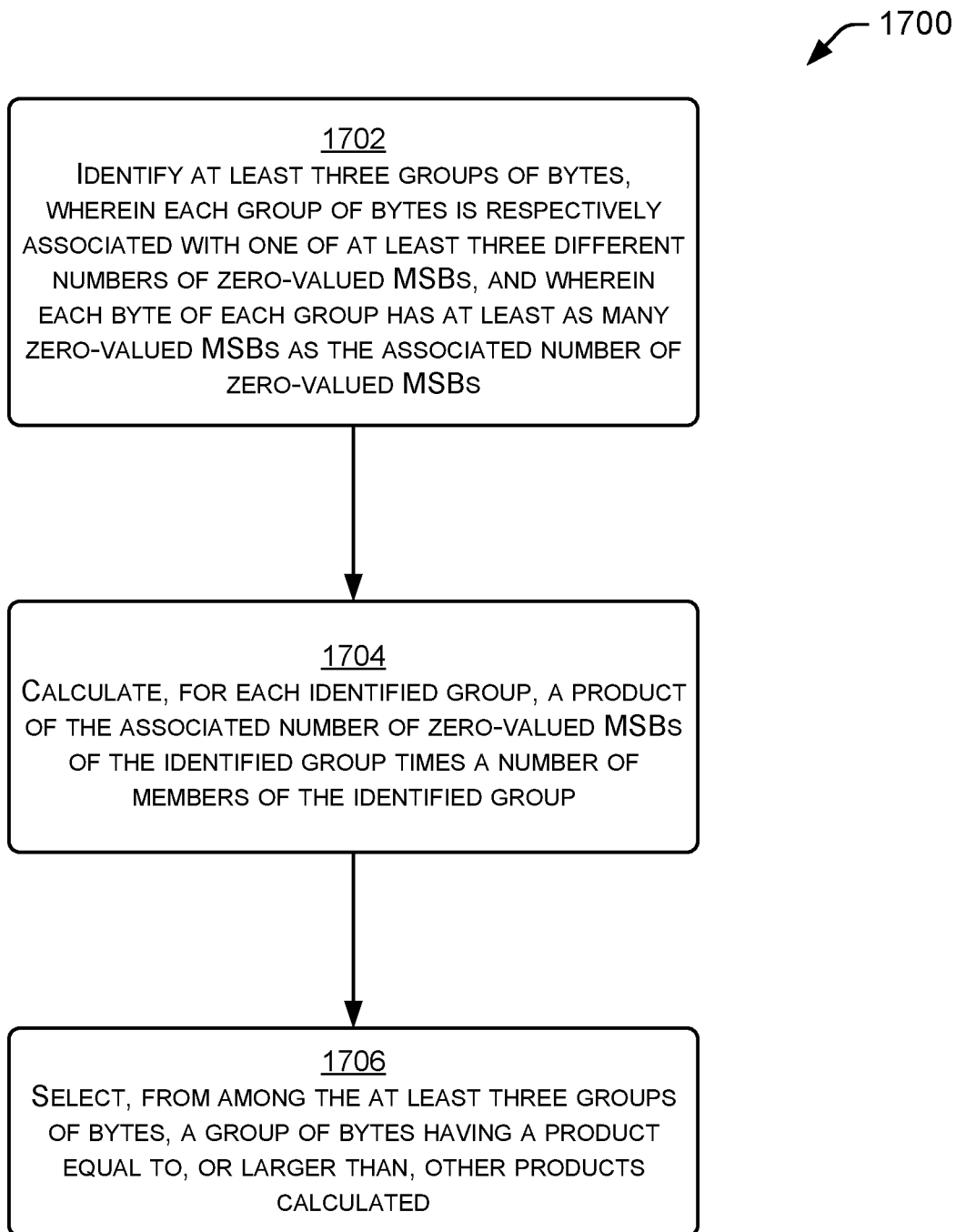
FIGS. 17 and 18 are flow diagrams showing example methods to be used, additionally or alternatively, to select data to be compressed.
Figure 18:
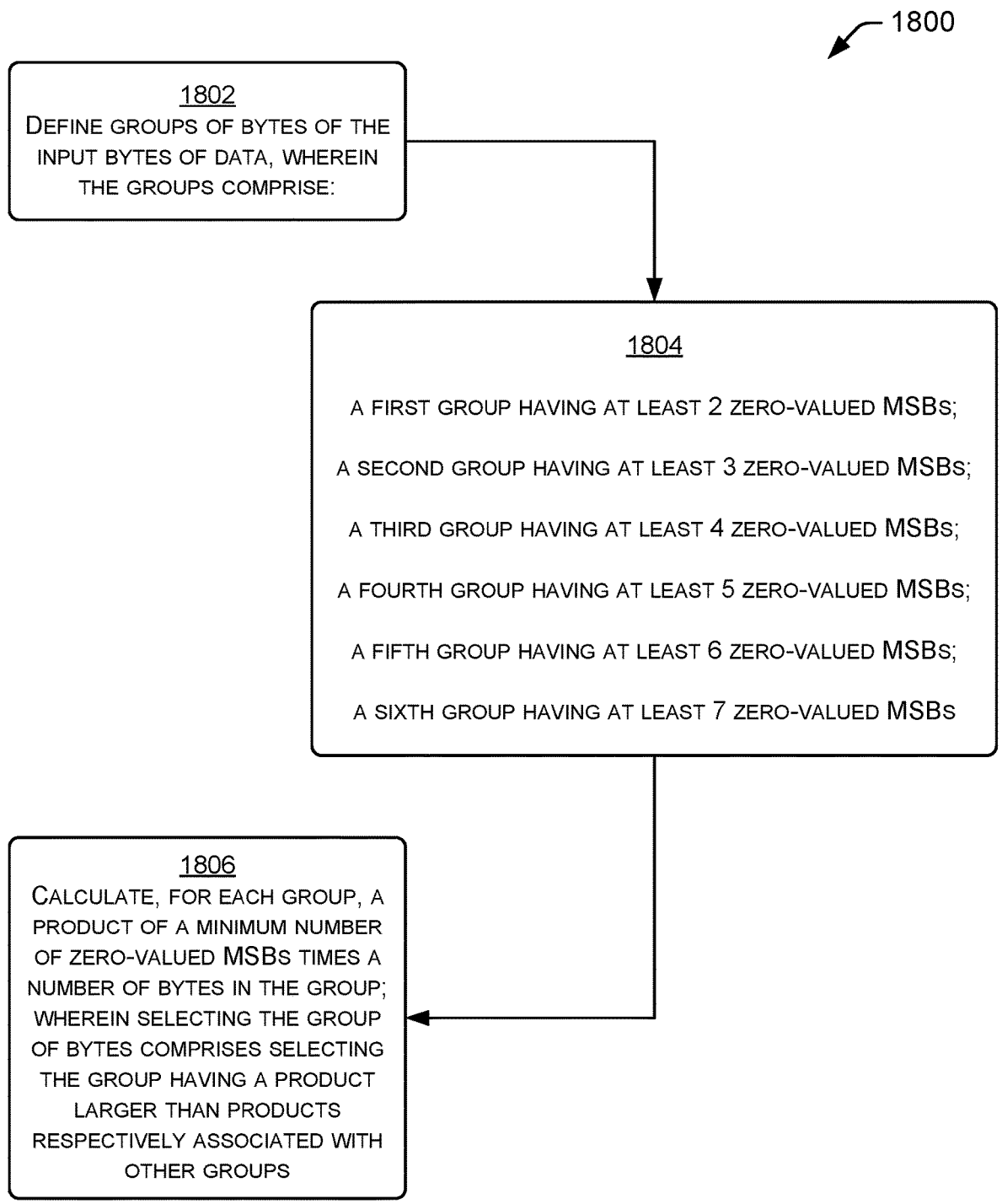

FIGS. 17 and 18 are flow diagrams showing example methods to be used, in concert or in the alternative, to select data to be compressed. Accordingly, the example methods include detail of block 1602 of FIG. 16. In some examples, the methods may involve deciding between a smaller group of bytes to compress that has a larger minimal number of zero-valued MSBs in each byte, or a larger group of bytes to compress that has a smaller minimal number of zero-valued MSBs in each byte.

FIG. 17 shows an example method 1700 to select data to be compressed. In an example, within input bytes of data, a group of bytes is selected having a first number of group-members, wherein all bytes in the group of bytes have at least a second number of zero-valued MSBs, and wherein a product of the first number times the second number is greater than, or equal to, products of any other groups of the input bytes of data configured to have at least some other number of zero-valued MSBs.

At block 1702, at least three groups of bytes are identified. Each group of bytes is respectively associated with one of at least three different numbers of zero-valued MSBs, and wherein each byte of each group has at least as many zero-valued MSBs as the associated number of zero-valued MSBs. In an example, groups of input bytes may be formed with each byte in the group having two, three, or four zero-valued MSBs.

At block 1704, for each identified group, a product of the associated number of zero-valued MSBs in each byte of the identified group times a number of members of the identified group is calculated.

At block 1706, from among the at least three groups of bytes, a group of bytes having a product equal to, or larger than, other products are determined and/or selected. By selecting such a group of bytes, removal of the same number of zero-valued MSBs from each byte will result in compression that is greater than, or equal to, the compression that could be obtained by selection of another group.

FIG. 18 shows a further example method 1800 to select data to be compressed. At block 1802, groups of bytes from the input bytes of data are defined. In the example of block 1804, the groups may include one or more of the following groups: a first group having at least 2 zero-valued MSBs; a second group having at least 3 zero-valued MSBs; a third group having at least 4 zero-valued MSBs; a fourth group having at least 5 zero-valued MSBs; a fifth group having at least 6 zero-valued MSBs; and/or a sixth group having at least 7 zero-valued MSBs.

At block 1806, for each group, calculate a product of a minimum number of zero-valued MSBs times a number of bytes in the group. In an example, the group of bytes selected (to be put into the compressed bytes array 220 of FIG. 2, for compression by removal of the number of zero-valued MSBs in all members of the group) has a product equal to, or larger than, products associated with other groups.

Figure 19:
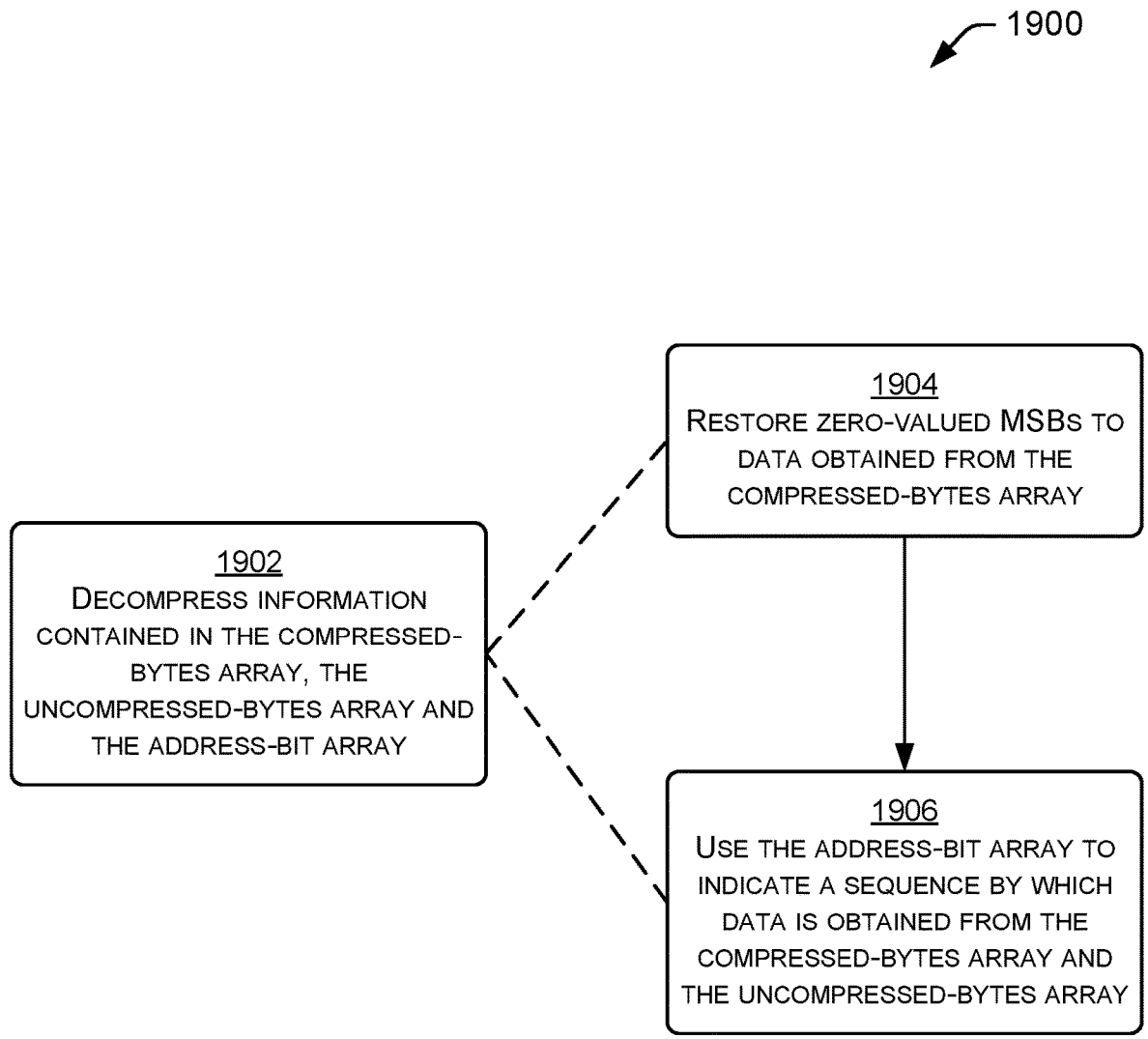
FIG. 19 is a flow diagram showing an example method to decompress data.

FIG. 19 shows an example method 1900 to decompress data. At block 1902, information contained in the compressed-bytes array, the uncompressed-bytes array and the address-bit array is decoded. In an example, the compressed bytes array is decompressed, resulting in bytes that are interleaved with bytes from the uncompressed-bytes array to reconstitute the input data before compression. The interleaving is performed based on information in the address-bit array.

Blocks 1904 and 1906 show example detail of how to decompress and/or decode the data as indicated by block 1902. At block 1904, zero-valued MSBs are restored to data obtained from the compressed-bytes array. In the example of FIG. 2, bits 224 show the number of bits removed in compression and/or encoding, and therefore the number of bits to be restored in decompression and/or decoding.

At block 1906, the address-bit array is used to indicate a sequence by which data is obtained from the compressed-bytes array and data obtained from the uncompressed-bytes array. Accordingly, data from the two sources is interleaved to form the output (i.e., decoded and/or decompressed) data.

Example Systems and Devices

The following examples of data compression techniques for efficient network management are expressed as number clauses. While the examples illustrate a number of possible configurations and techniques, they are not meant to be an exhaustive listing of the devices, systems, methods, and/or techniques described herein.

1. A method, comprising: receiving input data; determining whether, for a byte of the input data, a first value of the byte is distinct from other values in a first-instance array; based at least in part on the first value of the byte being distinct from other values in the first-instance array: adding the byte to the first-instance array; and adding a bit of a second value to an address-bit array; or based at least in part on the first value of the byte not being distinct from the other values in the first-instance array: adding an index value to an index array, wherein the index value indicates a location of the first value of the byte in the first-instance array; and adding a bit of a third value to the address-bit array.

2. The method of clause 1, additionally comprising: removing one or more most significant bits (MSBs) that are zero-valued for all bytes of the index array; and indicating, in a header of a message, a number of zero-valued MSBs removed from all bytes in the index array.

3. The method of clause 1, additionally comprising: determining a largest value from among bytes in the index array; determining a number of most significant bit (MSB) zeros present in the largest value; removing the determined number of MSB zeros from entries in the index array, thereby reducing a number of bits in the index array; and indicating the determined number of MSB zeros in a header of a packet containing the index array.

4. The method of clause 1, additionally comprising: configuring a packet header to indicate a type of compression that was used from among at least two types of compression.

5. The method of clause 1, additionally comprising: configuring a packet header to provide an indication within a first byte of the packet header to indicate if there is a second byte in the packet header.

6. The method of clause 1, additionally comprising: configuring a packet header of a packet to indicate that the address-bit array is present in the packet; wherein a bit of the address-bit array indicates use of compressed and non-compressed data for each byte of data.

7. The method of clause 1, additionally comprising: obtaining an address bit from the address-bit array, wherein: a first value of the address bit indicates obtaining a first byte from the first-instance array; or a second value of the address bit indicates obtaining a pointer from the index array and using the pointer to obtain a second byte from the first-instance array.

8. The method of clause 1, additionally comprising: configuring a packet header to indicate that one or more most significant bits were removed from each byte of the index array.

9. The method of clause 1, additionally comprising: confirming that a first volume of a combined data of the first-instance array, the index array, and the address-bit array is less than a second volume of the input data; and transmitting the combined data from a first node in a network to a second node in the network.

10. The method of clause 9, additionally comprising: decompressing the combined data according to a compression algorithm identified in a packet header.

11. A network device, comprising: one or more processors; one or more memory devices, in communication with the one or more processors; processor-executable instructions that, when executed by the one or more processors, configure the network device to perform acts comprising: receiving input data; determining whether, for a byte of the input data, a value of the byte is distinct from other values in a first-instance array; based at least in part on the value of the byte being distinct from other values in the first-instance array: adding the byte to the first-instance array; and adding a bit of a second value to an address-bit array; or based at least in part on the value of the byte not being distinct from other values in the first-instance array: adding an index value to an index array, wherein the index value indicates a location of the value of the byte in the first-instance array; and adding a bit of a third value to the address-bit array.

12. The network device as recited in clause 11, wherein the acts additionally comprise: determining a largest value from among bytes in the index array; determining a number of most significant bit (MSB) zeros present in the largest value; removing the determined number of MSB zeros from entries in the index array, thereby reducing a number of bits in the index array; and indicating the determined number of MSB zeros in a header of a packet containing the index array.

13. The network device as recited in clause 11, wherein the acts additionally comprise: confirming that a first volume of a combined data of the first-instance array, the index array, and the address-bit array is less than a second volume of the input data; and transmitting the combined data from a first node in a network to a second node in the network.

14. The network device as recited in clause 11, wherein adding the value of the byte to the first-instance array comprises: comparing the byte of the input data to values of bytes in the first-instance array to confirm that the byte of the input data is distinct before appending the byte of the input data to an end of the first-instance array.

15. The network device as recited in clause 11, wherein adding the index value to the index array comprises: comparing the byte of the input data to values of bytes in the first-instance array to confirm that the value of the byte is equal to a byte value already in the first-instance array before appending a pointer to the byte value already in the first-instance array to an end of the index array.

16. One or more computer-readable media storing computer-executable instructions that, when executed by one or more processors, configure a computing device to perform acts comprising: receiving input data; determining whether, for a byte of the input data, a first value of the byte is distinct from other values in a first-instance array; based at least in part on the first value of the byte being distinct from other values in the first-instance array: adding the byte to the first-instance array; and adding a bit of a second value to an address-bit array; or based at least in part on the first value of the byte not being distinct from other values in the first-instance array: adding an index value to an index array, wherein the index value indicates a location of the first value of the byte in the first-instance array; and adding a bit of a third value to the address-bit array; confirming that a first volume of a combined data of the first-instance array, the index array, and the address-bit array is less than a second volume of the input data; and transmitting the combined data from a first node in a network to a second node in the network.

17. One or more computer-readable media as recited in clause 16, wherein the acts additionally comprise: removing one or more most significant bits (MSBs) that are zero for all bytes in the index array; and indicating, in a header of a message, a number of MSBs removed from all bytes in the index array.

18. One or more computer-readable media as recited in clause 16, wherein the acts additionally comprise: determining a largest value from among bytes in the index array; determining a number of most significant bit (MSB) zeros present in the largest value; removing the determined number of zero-valued MSBs from entries in the index array, thereby reducing a number of bits in the index array; and indicating the determined number of zero-valued MSBs in a header of a packet containing the index array.

19. One or more computer-readable media as recited in clause 16, wherein the acts for adding the byte to the first-instance array additionally comprise: checking a value of each byte in the first-instance array to confirm that the byte of the input data is distinct before appending it to an end of the first-instance array.

20. One or more computer-readable media as recited in clause 16, wherein the acts for adding the index value to the index array additionally comprise: checking a value of each byte in the first-instance array to confirm that the byte of the input data is equal to a byte value already in the first-instance array before appending a pointer to the byte value already in the first-instance array to an end of the index array.

1. A method, comprising: selecting, from among input bytes of data, a group of bytes each having at least two zero-valued most significant bits (MSBs), wherein a product of a number of bytes in the group of bytes multiplied by a number of zero-valued MSBs in all bytes of the group of bytes is greater than a number of the input bytes of data; forming a compressed-bytes array with data of the group of bytes, wherein the number of zero-valued MSBs originally present in all of the bytes of the group of bytes has been removed; forming an uncompressed-bytes array with bytes of the input bytes of data not in the selected group of bytes; and forming an address-bit array to indicate in which array information associated with each of the input bytes of data is stored.

2. The method of clause 1, additionally comprising: forming a packet comprising the compressed-bytes array, the uncompressed-bytes array, the address-bit array, and a header; and recording, in bits of the header, the number of zero-valued MSBs removed from all of the bytes of the compressed-bytes array.

3. The method of clause 1, wherein selecting the group of bytes comprises: identifying at least three groups of bytes, wherein each group of bytes is respectively associated with one of at least three different numbers of zero-valued MSBs, and wherein each byte of each group has at least as many zero-valued MSBs as the associated number of zero-valued MSBs; calculating, for each identified group, a product of the associated number of zero-valued MSBs of the identified group times a number of members of the identified group; and selecting, from among the at least three groups of bytes, a group of bytes having a product equal to, or larger than, other products calculated.

4. The method of clause 1, wherein selecting the group of bytes comprises: selecting, within the input bytes of data, a group of bytes having a first number of group-members, wherein all bytes in the group of bytes have at least a second number of zero-valued MSBs, and wherein a product of the first number times the second number is greater than, or equal to, products of any other groups of the input bytes of data configured to have at least some other number of zero-valued MSBs.

5. The method of clause 1, wherein selecting the group of bytes comprises: defining groups of bytes of the input bytes of data, wherein the groups comprise: a first group having at least 2 zero-valued MSBs; a second group having at least 3 zero-valued MSBs; a third group having at least 4 zero-valued MSBs; a fourth group having at least 5 zero-valued MSBs; a fifth group having at least 6 zero-valued MSBs; and a sixth group having at least 7 zero-valued MSBs; and calculating, for each group, a product of a minimum number of zero-valued MSBs times a number of bytes in the group; wherein selecting the group of bytes comprises selecting the group having a product larger than products respectively associated with other groups.

6. The method of clause 1, additionally comprising: sending a packet comprising the compressed-bytes array, the uncompressed-bytes array, and the address-bit array.

7. The method of clause 1, additionally comprising: configuring a header of a packet to indicate a number of MSBs removed from bytes in the compressed-bytes array.

8. The method of clause 1, additionally comprising decompressing information contained in the compressed-bytes array, the uncompressed-bytes array and the address-bit array, wherein the decompressing comprises: restoring zero-valued MSBs to data obtained from the compressed-bytes array; and using the address-bit array to indicate a sequence by which data from the compressed-bytes array and the uncompressed-bytes array is ordered.

9. A network node, comprising: a processor; one or more memory devices in communication with the processor; a data compression application, wherein the data compression application is defined in the one or more memory devices and comprises statements executed by the processor to perform actions comprising: selecting, from among input bytes of data, a group of bytes having a first number of group-members, wherein all bytes in the group of bytes have at least a second number of zero-valued MSBs, and wherein a product of the first number times the second number is greater than, or equal to, products of any other groups of the input bytes of data configured to have at least some other number of zero-valued MSBs; forming a compressed-bytes array with data of the group of bytes, wherein the second number of zero-valued MSBs originally present in all of the bytes of the group of bytes has been removed; forming an uncompressed-bytes array with bytes of the input bytes of data not in the selected group of bytes; and forming an address-bit array to indicate in which array information associated with each of the input bytes of data is stored.

10. The network node of clause 9, additionally comprising: a data compression application, wherein the data compression application is defined in the one or more memory devices and comprises statements executed by the processor to perform actions comprising: restoring zero-valued MSBs to data obtained from the compressed-bytes array; and using the address-bit array to indicate a sequence by which data from the compressed-bytes array and the uncompressed-bytes array is ordered.

11. The network node of clause 9, wherein selecting the group of bytes comprises: identifying at least three groups of bytes respectively associated with three different minimal numbers of zero-valued MSBs, wherein the three different minimal number of zero-valued MSBs are all between two and six, inclusive; calculating, for each identified group, a product of the minimal number of zero-valued MSBs of the identified group times a number of members of the identified group; and selecting the group of bytes that has a product equal to, or larger than, other products calculated.

12. The network node of clause 9, wherein selecting the group of bytes comprises: defining groups of bytes of the input bytes of data, wherein the groups of bytes comprise: a first group having at least 2 zero-valued MSBs; a second group having at least 3 zero-valued MSBs; a third group having at least 4 zero-valued MSBs; a fourth group having at least 5 zero-valued MSBs; a fifth group having at least 6 zero-valued MSBs; and a sixth group having at least 7 zero-valued MSBs; and calculating, for each group, a product of a minimum number of zero-valued MSBs times a number of bytes in the group; wherein selecting the group of bytes comprises selecting the group having the largest product.

13. The network node of clause 9, wherein the processor additionally performs actions comprising: sending a packet comprising the compressed-bytes array, the uncompressed-bytes array, and the address-bit array.

14. The network node of clause 9, wherein the processor additionally performs actions comprising: forming a packet comprising the compressed-bytes array, the uncompressed-bytes array and the address-bit array; and indicating, in a header of the packet, a number of zero-valued MSBs removed from the compressed-bytes array.

15. One or more computer-readable media storing computer-executable instructions that, when executed by one or more processors, configure a computing device to perform acts comprising: selecting, from among input bytes of data, a group of bytes each having at least two zero-valued most significant bits (MSBs), wherein a product of a number of bytes in the group of bytes multiplied by a number of zero-valued MSBs in all bytes of the group of bytes is greater than a number of the input bytes of data; forming a compressed-bytes array with data of the group of bytes, wherein the number of zero-valued MSBs originally present in all of the bytes of the group of bytes has been removed; forming an uncompressed-bytes array with bytes of the input bytes of data not in the selected group of bytes; and forming an address-bit array to indicate in which array information associated with each of the input bytes of data is stored.

16. One or more computer-readable media as recited in clause 15, wherein the acts additionally comprise: forming a packet comprising the compressed-bytes array, the uncompressed-bytes array, the address-bit array, and a header; and recording, in bits of the header, the number of zero-valued MSBs originally present in all of the bytes of the selected group of bytes.

17. One or more computer-readable media as recited in clause 15, wherein the acts for selecting the group of bytes additionally comprise: identifying at least three groups of bytes respectively associated with at least three different minimal numbers of zero-valued MSBs, wherein the at least three different minimal number of zero-valued MSBs are all between two and six, inclusive; calculating, for each identified group, a product of a minimal number of zero-valued MSBs of the identified group times a number of members of the identified group; and selecting the group of bytes that has a product equal to, or larger than, other products calculated.

18. One or more computer-readable media as recited in clause 15, wherein the acts for selecting the group of bytes additionally comprise: selecting, within the input bytes of data, a group of bytes having a first number of group-members, wherein all bytes in the group of bytes have at least a second number of zero-valued MSBs, and wherein a product of the first number times the second number is greater than, or equal to, products of any other groups of the input bytes configured to have at least some other number of zero-valued MSBs.

19. One or more computer-readable media as recited in clause 15, wherein the acts additionally comprise: configuring a header of a packet to indicate that compressed data is contained by a payload of the packet; and sending a packet comprising the header, the compressed-bytes array, the uncompressed-bytes array, and the address-bit array.

20. One or more computer-readable media as recited in clause 15, wherein the acts additionally comprise: decompressing information contained in the compressed-bytes array, the uncompressed-bytes array and the address-bit array, wherein the decompressing comprises: restoring zero-valued MSBs to data obtained from the compressed-bytes array; and using the address-bit array to indicate a sequence by which data from the compressed-bytes array and the uncompressed-bytes array is ordered.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

The invention claimed is:

1. A method, comprising:
selecting, from among input bytes of data, a group of bytes each having at least two zero-valued most significant bits (MSBs), wherein a product of a number of bytes in the group of bytes multiplied by a number of zero-valued MSBs in all bytes of the group of bytes is greater than a number of the input bytes of data;
forming a compressed-bytes array with data of the group of bytes, wherein the number of zero-valued MSBs originally present in all of the bytes of the group of bytes has been removed;
forming an uncompressed-bytes array with bytes of the input bytes of data not in the selected group of bytes; and
forming an address-bit array to indicate in which array information associated with each of the input bytes of data is stored.

2. The method of claim 1, additionally comprising:
forming a packet comprising the compressed-bytes array, the uncompressed-bytes array, the address-bit array, and a header; and
recording, in bits of the header, the number of zero-valued MSBs removed from all of the bytes of the compressed-bytes array.

3. The method of claim 1, wherein selecting the group of bytes comprises:
identifying at least three groups of bytes, wherein each group of bytes is respectively associated with one of at least three different numbers of zero-valued MSBs, and wherein each byte of each group has at least as many zero-valued MSBs as the associated number of zero-valued MSBs;
calculating, for each identified group, a product of the associated number of zero-valued MSBs of the identified group times a number of members of the identified group; and
selecting, from among the at least three groups of bytes, a group of bytes having a product equal to, or larger than, other products calculated.

4. The method of claim 1, wherein selecting the group of bytes comprises:
selecting, within the input bytes of data, a group of bytes having a first number of group-members, wherein all bytes in the group of bytes have at least a second number of zero-valued MSBs, and wherein a product of the first number times the second number is greater than, or equal to, products of any other groups of the input bytes of data configured to have at least some other number of zero-valued MSBs.

5. The method of claim 1, wherein selecting the group of bytes comprises:
defining groups of bytes of the input bytes of data, wherein the groups comprise:
a first group having at least 2 zero-valued MSBs;
a second group having at least 3 zero-valued MSBs;
a third group having at least 4 zero-valued MSBs;
a fourth group having at least 5 zero-valued MSBs;
a fifth group having at least 6 zero-valued MSBs; and
a sixth group having at least 7 zero-valued MSBs; and
calculating, for each group, a product of a minimum number of zero-valued MSBs times a number of bytes in the group;
wherein selecting the group of bytes comprises selecting the group having a product larger than products respectively associated with other groups.

6. The method of claim 1, additionally comprising:
sending a packet comprising the compressed-bytes array, the uncompressed-bytes array, and the address-bit array.

7. The method of claim 1, additionally comprising:
configuring a header of a packet to indicate a number of MSBs removed from bytes in the compressed-bytes array.

8. The method of claim 1, additionally comprising decompressing information contained in the compressed-bytes array, the uncompressed-bytes array and the address-bit array, wherein the decompressing comprises:
  restoring zero-valued MSBs to data obtained from the compressed-bytes array; and
  using the address-bit array to indicate a sequence by which data from the compressed-bytes array and the uncompressed-bytes array is ordered.

9. A network node, comprising:
  a processor;
  one or more memory devices in communication with the processor;
  a data compression application, wherein the data compression application is defined in the one or more memory devices and comprises statements executed by the processor to perform actions comprising:
    selecting, from among input bytes of data, a group of bytes having a first number of group-members, wherein all bytes in the group of bytes have at least a second number of zero-valued MSBs, and wherein a product of the first number times the second number is greater than, or equal to, products of any other groups of the input bytes of data configured to have at least some other number of zero-valued MSBs;
    forming a compressed-bytes array with data of the group of bytes, wherein the second number of zero-valued MSBs originally present in all of the bytes of the group of bytes has been removed;
    forming an uncompressed-bytes array with bytes of the input bytes of data not in the selected group of bytes; and
    forming an address-bit array to indicate in which array information associated with each of the input bytes of data is stored.

10. The network node of claim 9, additionally comprising:
  a data compression application, wherein the data compression application is defined in the one or more memory devices and comprises statements executed by the processor to perform actions comprising:
    restoring zero-valued MSBs to data obtained from the compressed-bytes array; and
    using the address-bit array to indicate a sequence by which data from the compressed-bytes array and the uncompressed-bytes array is ordered.

11. The network node of claim 9, wherein selecting the group of bytes comprises:
  identifying at least three groups of bytes respectively associated with three different minimal numbers of zero-valued MSBs, wherein the three different minimal number of zero-valued MSBs are all between two and six, inclusive;
  calculating, for each identified group, a product of the minimal number of zero-valued MSBs of the identified group times a number of members of the identified group; and
  selecting the group of bytes that has a product equal to, or larger than, other products calculated.

12. The network node of claim 9, wherein selecting the group of bytes comprises:
  defining groups of bytes of the input bytes of data, wherein the groups of bytes comprise:
    a first group having at least 2 zero-valued MSBs;
    a second group having at least 3 zero-valued MSBs;
    a third group having at least 4 zero-valued MSBs;
    a fourth group having at least 5 zero-valued MSBs;
    a fifth group having at least 6 zero-valued MSBs; and
    a sixth group having at least 7 zero-valued MSBs; and
  calculating, for each group, a product of a minimum number of zero-valued MSBs times a number of bytes in the group;
  wherein selecting the group of bytes comprises selecting the group having the largest product.

13. The network node of claim 9, wherein the processor additionally performs actions comprising:
  sending a packet comprising the compressed-bytes array, the uncompressed-bytes array, and the address-bit array.

14. The network node of claim 9, wherein the processor additionally performs actions comprising:
  forming a packet comprising the compressed-bytes array, the uncompressed-bytes array and the address-bit array; and
  indicating, in a header of the packet, a number of zero-valued MSBs removed from the compressed-bytes array.

15. One or more computer-readable media storing computer-executable instructions that, when executed by one or more processors, configure a computing device to perform acts comprising:
  selecting, from among input bytes of data, a group of bytes each having at least two zero-valued most significant bits (MSBs), wherein a product of a number of bytes in the group of bytes multiplied by a number of zero-valued MSBs in all bytes of the group of bytes is greater than a number of the input bytes of data;
  forming a compressed-bytes array with data of the group of bytes, wherein the number of zero-valued MSBs originally present in all of the bytes of the group of bytes has been removed;
  forming an uncompressed-bytes array with bytes of the input bytes of data not in the selected group of bytes; and
  forming an address-bit array to indicate in which array information associated with each of the input bytes of data is stored.

16. One or more computer-readable media as recited in claim 15, wherein the acts additionally comprise:
  forming a packet comprising the compressed-bytes array, the uncompressed-bytes array, the address-bit array, and a header; and
  recording, in bits of the header, the number of zero-valued MSBs originally present in all of the bytes of the selected group of bytes.

17. One or more computer-readable media as recited in claim 15, wherein the acts for selecting the group of bytes additionally comprise:
  identifying at least three groups of bytes respectively associated with at least three different minimal numbers of zero-valued MSBs, wherein the at least three different minimal number of zero-valued MSBs are all between two and six, inclusive;
  calculating, for each identified group, a product of a minimal number of zero-valued MSBs of the identified group times a number of members of the identified group; and
  selecting the group of bytes that has a product equal to, or larger than, other products calculated.

18. One or more computer-readable media as recited in claim 15, wherein the acts for selecting the group of bytes additionally comprise:
  selecting, within the input bytes of data, a group of bytes having a first number of group-members, wherein all bytes in the group of bytes have at least a second number of zero-valued MSBs, and wherein a product of the first number times the second number is greater than, or equal to, products of any other groups of the input bytes configured to have at least some other number of zero-valued MSBs.

19. One or more computer-readable media as recited in claim 15, wherein the acts additionally comprise:
configuring a header of a packet to indicate that compressed data is contained by a payload of the packet; and
sending a packet comprising the header, the compressed-bytes array, the uncompressed-bytes array, and the address-bit array.

20. One or more computer-readable media as recited in claim 15, wherein the acts additionally comprise:
decompressing information contained in the compressed-bytes array, the uncompressed-bytes array and the address-bit array, wherein the decompressing comprises:
restoring zero-valued MSBs to data obtained from the compressed-bytes array; and
using the address-bit array to indicate a sequence by which data from the compressed-bytes array and the uncompressed-bytes array is ordered.

* * * * *